US011258398B2

(12) United States Patent
Almy et al.

(10) Patent No.: US 11,258,398 B2
(45) Date of Patent: Feb. 22, 2022

(54) MULTI-REGION SOLAR ROOFING MODULES

(71) Applicant: Tesla, Inc., Palo Alto, CA (US)

(72) Inventors: Charles Almy, Berkeley, CA (US); Kathryn Austin Pesce, San Francisco, CA (US); David Molina, Oakland, CA (US)

(73) Assignee: Tesla, Inc., Austin, TX (US)

( * ) Notice: Subject to any disclaimer, the term of this patent is extended or adjusted under 35 U.S.C. 154(b) by 45 days.

(21) Appl. No.: 15/686,109

(22) Filed: Aug. 24, 2017

(65) Prior Publication Data

US 2018/0351502 A1 Dec. 6, 2018

Related U.S. Application Data

(60) Provisional application No. 62/515,434, filed on Jun. 5, 2017.

(51) Int. Cl.
*H02S 20/25* (2014.01)
*H02S 30/10* (2014.01)
(Continued)

(52) U.S. Cl.
CPC ............ *H02S 20/25* (2014.12); *E04B 1/62* (2013.01); *E04D 1/12* (2013.01); *E04D 1/2984* (2019.08);
(Continued)

(58) Field of Classification Search
CPC .......... H02S 20/25; H02S 20/23; H02S 20/20; H02S 30/10; H02S 40/32; H02S 40/34;
(Continued)

(56) References Cited

U.S. PATENT DOCUMENTS 352,424 A 11/1886 Owen et al.
3,076,861 A 2/1963 Samulon et al.
(Continued)

FOREIGN PATENT DOCUMENTS

CN 102544380 B 8/2015
CN 103426957 B 3/2016
(Continued)

OTHER PUBLICATIONS

English translation of EP 2243901 (Year: 2010).*
(Continued)

*Primary Examiner* — Magali P Slawski
*Assistant Examiner* — Kourtney R S Carlson
(74) *Attorney, Agent, or Firm* — Dentons US LLP

(57) ABSTRACT

Building integrated photovoltaic (BIPV) systems provide for solar panel arrays that can be aesthetically pleasing to an observer. BIPV systems can be incorporated as part of roof surfaces as built into the structure of the roof, particularly as multi-region roofing modules that have photovoltaic elements embedded or incorporated into the body of the module, in distinct tiles-sized regions. Such multi-region photovoltaic modules can replicate the look of individual roofing tiles or shingles. Further, multi-region photovoltaic modules can include support structures between the distinct regions having a degree of flexibility, allowing for a more efficient installation process.

11 Claims, 13 Drawing Sheets

(51) Int. Cl.
    *E04D 1/12*         (2006.01)
    *E04D 1/30*         (2006.01)
    *H01L 31/048*     (2014.01)
    *E04B 1/62*         (2006.01)
    *F24S 25/613*     (2018.01)
    *H01L 31/02*       (2006.01)
    *H02S 20/23*       (2014.01)
    *H02S 40/36*       (2014.01)
    *H01L 31/05*       (2014.01)
    *E04D 1/36*         (2006.01)
    *H02S 40/34*       (2014.01)
    *H02S 40/32*       (2014.01)
    *E04D 1/00*         (2006.01)
    *F24S 20/00*       (2018.01)
    *F24S 25/60*       (2018.01)

(52) U.S. Cl.
    CPC .............. *E04D 1/30* (2013.01); *E04D 1/365* (2013.01); *F24S 25/613* (2018.05); *H01L 31/02021* (2013.01); *H01L 31/048* (2013.01); *H01L 31/0508* (2013.01); *H02S 20/23* (2014.12); *H02S 30/10* (2014.12); *H02S 40/32* (2014.12); *H02S 40/34* (2014.12); *H02S 40/36* (2014.12); *F24S 2020/13* (2018.05); *F24S 2025/6002* (2018.05)

(58) Field of Classification Search
    CPC . H02S 40/36; E04B 1/62; E04B 1/112; E04B 1/30; E04B 1/365; F24S 25/613
    See application file for complete search history.

(56) References Cited

U.S. PATENT DOCUMENTS

| | | |
|---|---|---|
| 3,369,939 A | 2/1968 | Myer |
| 3,459,391 A | 8/1969 | Haynos |
| 3,461,602 A | 8/1969 | Hasel et al. |
| 4,040,867 A | 8/1977 | Forestieri et al. |
| 4,239,810 A | 12/1980 | Alameddine et al. |
| 4,336,413 A | 6/1982 | Tourneux |
| 4,400,577 A | 8/1983 | Spear |
| 4,623,753 A | 11/1986 | Feldman et al. |
| 4,724,011 A | 2/1988 | Turner et al. |
| 4,946,512 A | 8/1990 | Fukuroi et al. |
| 5,112,408 A | 5/1992 | Melchior |
| 5,118,540 A | 6/1992 | Hutchison |
| 5,316,592 A | 5/1994 | Dinwoodie |
| 5,338,369 A | 8/1994 | Rawlings |
| 5,427,961 A | 6/1995 | Takenouchi et al. |
| 5,437,735 A * | 8/1995 | Younan ................ H02S 20/25 136/251 |
| 5,482,569 A * | 1/1996 | Ihara et al. |
| 5,571,338 A | 11/1996 | Kadonome et al. |
| 5,575,861 A | 11/1996 | Younan et al. |
| 5,590,495 A | 1/1997 | Bressler et al. |
| 5,596,981 A | 1/1997 | Soucy |
| 5,667,596 A | 9/1997 | Tsuzuki et al. |
| 5,701,067 A * | 12/1997 | Kaji ................ H02S 30/20 320/101 |
| 5,919,316 A | 7/1999 | Bogorad et al. |
| 5,942,048 A | 8/1999 | Fujisaki et al. |
| 6,093,884 A | 7/2000 | Toyomura et al. |
| 6,133,522 A | 10/2000 | Kataoka et al. |
| 6,186,698 B1 | 2/2001 | Knapp |
| 6,307,144 B1 | 10/2001 | Mimura et al. |
| 6,311,436 B1 | 11/2001 | Mimura et al. |
| 6,365,824 B1 | 4/2002 | Nakazima et al. |
| 6,465,724 B1 | 10/2002 | Garvison et al. |
| 6,472,594 B1 | 10/2002 | Ichinose et al. |
| 6,515,216 B2 | 2/2003 | Zenko et al. |
| 6,586,271 B2 | 7/2003 | Hanoka |
| 6,620,645 B2 | 9/2003 | Chandra et al. |
| 6,670,541 B2 | 12/2003 | Nagao et al. |
| 6,672,018 B2 | 1/2004 | Shingleton |
| 6,883,290 B2 | 4/2005 | Dinwoodie |
| 6,959,520 B2 | 11/2005 | Hartman |
| 6,960,716 B2 | 11/2005 | Matsumi et al. |
| 7,012,188 B2 | 3/2006 | Erling |
| 7,259,321 B2 | 8/2007 | Oswald et al. |
| 7,276,724 B2 | 10/2007 | Sheats et al. |
| 7,328,534 B2 | 2/2008 | Dinwoodie |
| 7,506,477 B2 | 3/2009 | Flaherty et al. |
| 7,534,956 B2 | 5/2009 | Kataoka et al. |
| 7,772,484 B2 | 8/2010 | Li et al. |
| 7,833,808 B2 | 11/2010 | Xu et al. |
| 7,851,700 B2 | 12/2010 | Luch |
| 7,858,874 B2 | 12/2010 | Ruskin et al. |
| 7,902,451 B2 | 3/2011 | Shimizu |
| 7,964,440 B2 | 6/2011 | Salleo et al. |
| 8,109,048 B2 | 2/2012 | West et al. |
| 8,141,306 B2 | 3/2012 | Masuda et al. |
| 8,156,697 B2 | 4/2012 | Miros et al. |
| 8,205,400 B2 | 6/2012 | Allen |
| 8,206,664 B2 | 6/2012 | Lin |
| 8,276,329 B2 | 10/2012 | Lenox |
| 8,307,606 B1 | 11/2012 | Rego et al. |
| 8,471,141 B2 | 6/2013 | Stancel et al. |
| 8,519,531 B2 | 8/2013 | Pilat et al. |
| 8,601,754 B2 | 12/2013 | Jenkins et al. |
| 8,664,030 B2 | 3/2014 | Luch |
| 8,674,377 B2 | 3/2014 | Farquhar |
| 8,697,981 B2 | 4/2014 | Adriani et al. |
| 8,701,360 B2 | 4/2014 | Ressler |
| 8,713,861 B2 | 5/2014 | Desloover |
| 8,740,642 B2 | 6/2014 | Keenihan et al. |
| 8,763,322 B2 | 7/2014 | Hamamura |
| 8,822,810 B2 | 9/2014 | Luch |
| 8,869,470 B2 | 10/2014 | Lanza |
| 8,919,075 B2 | 12/2014 | Erickson |
| 9,000,288 B2 | 4/2015 | Hoang et al. |
| 9,012,763 B2 | 4/2015 | Frolov et al. |
| 9,038,330 B2 | 5/2015 | Bellavia |
| 9,150,966 B2 | 10/2015 | Xu et al. |
| 9,206,520 B2 | 12/2015 | Barr et al. |
| 9,343,592 B2 | 5/2016 | Hunt |
| 9,356,173 B2 | 5/2016 | Okandan et al. |
| 9,362,527 B2 | 6/2016 | Takemura |
| 9,412,884 B2 | 8/2016 | Heng et al. |
| 9,412,890 B1 | 8/2016 | Meyers |
| 9,435,568 B2 | 9/2016 | Smidt et al. |
| 9,496,423 B2 | 11/2016 | Loeckenhoff et al. |
| 9,496,819 B2 | 11/2016 | Hsueh et al. |
| 9,518,391 B2 | 12/2016 | Haynes et al. |
| 9,525,092 B2 | 12/2016 | Mayer et al. |
| 9,673,750 B2 | 6/2017 | Schoop et al. |
| 9,685,579 B2 | 6/2017 | Gonzalez et al. |
| 9,825,582 B2 | 11/2017 | Fernandes et al. |
| 9,882,077 B2 | 1/2018 | Morad et al. |
| 9,899,554 B2 | 2/2018 | Yang et al. |
| 9,935,222 B1 | 4/2018 | Zhou et al. |
| 9,954,480 B2 | 4/2018 | Haynes et al. |
| 9,966,487 B2 | 5/2018 | Magnusdottir et al. |
| 10,056,522 B2 | 8/2018 | Gonzalez |
| 10,145,116 B2 | 12/2018 | Holt et al. |
| 10,151,114 B2 | 12/2018 | Stearns et al. |
| 10,177,708 B2 | 1/2019 | Cruz |
| 10,256,765 B2 | 4/2019 | Rodrigues et al. |
| 10,461,685 B2 | 10/2019 | Anderson et al. |
| 10,563,406 B2 | 2/2020 | Kalkanoglu et al. |
| 2001/0054435 A1 | 12/2001 | Nagao et al. |
| 2002/0015782 A1 | 2/2002 | Abys et al. |
| 2003/0010377 A1 | 1/2003 | Fukuda et al. |
| 2003/0180983 A1 | 9/2003 | Oswald et al. |
| 2004/0261840 A1 | 12/2004 | Schmit et al. |
| 2005/0022857 A1 | 2/2005 | Daroczi et al. |
| 2005/0039788 A1 | 2/2005 | Blieske et al. |
| 2005/0268963 A1 | 12/2005 | Jordan et al. |
| 2006/0048798 A1 | 3/2006 | Mccoy et al. |
| 2006/0086620 A1 | 4/2006 | Chase et al. |
| 2006/0102380 A1 | 5/2006 | Hu |
| 2006/0204730 A1 | 9/2006 | Nakamura et al. |

(56) References Cited

U.S. PATENT DOCUMENTS

| | | |
|---|---|---|
| 2007/0011898 A1 | 1/2007 | Frank et al. |
| 2008/0053511 A1 | 3/2008 | Nakamura |
| 2008/0135085 A1 | 6/2008 | Corrales et al. |
| 2008/0149170 A1 | 6/2008 | Hanoka |
| 2008/0231768 A1 | 9/2008 | Okabe |
| 2008/0271773 A1* | 11/2008 | Jacobs ................. E04D 1/20 136/244 |
| 2008/0302030 A1 | 12/2008 | Stancel et al. |
| 2009/0101192 A1 | 4/2009 | Kothari et al. |
| 2009/0120497 A1 | 5/2009 | Schetty, III |
| 2009/0133739 A1 | 5/2009 | Shiao et al. |
| 2009/0133740 A1 | 5/2009 | Shiao et al. |
| 2009/0233083 A1 | 9/2009 | Inoue et al. |
| 2009/0242021 A1 | 10/2009 | Petkie et al. |
| 2009/0287446 A1 | 11/2009 | Wang et al. |
| 2009/0308435 A1 | 12/2009 | Caiger |
| 2010/0000603 A1 | 1/2010 | Tsuzuki et al. |
| 2010/0006147 A1 | 1/2010 | Nakashima et al. |
| 2010/0018568 A1 | 1/2010 | Nakata |
| 2010/0116330 A1 | 5/2010 | Inoue |
| 2010/0132762 A1 | 6/2010 | Graham et al. |
| 2010/0147363 A1 | 6/2010 | Huang et al. |
| 2010/0147364 A1 | 6/2010 | Gonzalez et al. |
| 2010/0180929 A1 | 7/2010 | Raymond et al. |
| 2011/0017278 A1* | 1/2011 | Kalkanoglu ........... H02S 20/23 136/251 |
| 2011/0023937 A1 | 2/2011 | Daniel et al. |
| 2011/0023942 A1 | 2/2011 | Soegding et al. |
| 2011/0030761 A1 | 2/2011 | Kalkanoglu et al. |
| 2011/0047902 A1 | 3/2011 | Cryar |
| 2011/0048507 A1* | 3/2011 | Livsey ................. H01L 31/048 136/251 |
| 2011/0100436 A1* | 5/2011 | Cleereman ........ H01L 31/02013 136/251 |
| 2011/0155209 A1 | 6/2011 | Tober et al. |
| 2011/0203637 A1 | 8/2011 | Patton et al. |
| 2011/0253193 A1* | 10/2011 | Korman ............. H01L 31/0512 136/245 |
| 2011/0277825 A1 | 11/2011 | Fu et al. |
| 2011/0290307 A1 | 12/2011 | Workman et al. |
| 2012/0000502 A1 | 1/2012 | Wiedeman et al. |
| 2012/0012162 A1 | 1/2012 | Kobayashi |
| 2012/0031470 A1 | 2/2012 | Dimov et al. |
| 2012/0048349 A1 | 3/2012 | Metin et al. |
| 2012/0060911 A1 | 3/2012 | Fu et al. |
| 2012/0125391 A1 | 5/2012 | Pinarbasi et al. |
| 2012/0199184 A1 | 8/2012 | Nie et al. |
| 2012/0204927 A1 | 8/2012 | Peterson et al. |
| 2012/0237670 A1 | 9/2012 | Lim et al. |
| 2013/0048062 A1 | 2/2013 | Min et al. |
| 2013/0061913 A1 | 3/2013 | Willham et al. |
| 2013/0098420 A1 | 4/2013 | Sherman et al. |
| 2013/0112239 A1 | 5/2013 | Liptac et al. |
| 2013/0160823 A1 | 6/2013 | Khouri et al. |
| 2013/0206213 A1 | 8/2013 | He et al. |
| 2013/0209776 A1 | 8/2013 | Kim |
| 2013/0233378 A1 | 9/2013 | Moslehi et al. |
| 2013/0239495 A1 | 9/2013 | Galitev et al. |
| 2013/0247959 A1 | 9/2013 | Kwon et al. |
| 2013/0255755 A1 | 10/2013 | Chich |
| 2013/0280521 A1 | 10/2013 | Mori |
| 2013/0284241 A1 | 10/2013 | Georgi et al. |
| 2014/0120699 A1 | 5/2014 | Hua et al. |
| 2014/0124013 A1 | 5/2014 | Morad et al. |
| 2014/0124014 A1 | 5/2014 | Morad et al. |
| 2014/0196768 A1 | 7/2014 | Heng et al. |
| 2014/0246549 A1 | 9/2014 | West et al. |
| 2014/0313574 A1 | 10/2014 | Bills et al. |
| 2014/0360582 A1 | 12/2014 | Cui et al. |
| 2015/0083191 A1* | 3/2015 | Gmundner .............. H02S 30/20 136/245 |
| 2015/0090314 A1 | 4/2015 | Yang et al. |
| 2015/0155824 A1 | 6/2015 | Chien |
| 2015/0194552 A1 | 7/2015 | Ogasahara et al. |
| 2015/0243931 A1 | 8/2015 | Fukuura |
| 2015/0270410 A1 | 9/2015 | Heng et al. |
| 2015/0349145 A1 | 12/2015 | Morad et al. |
| 2015/0349152 A1 | 12/2015 | Voss et al. |
| 2015/0349703 A1 | 12/2015 | Morad et al. |
| 2016/0013329 A1 | 1/2016 | Brophy et al. |
| 2016/0105144 A1 | 4/2016 | Haynes et al. |
| 2016/0163902 A1 | 6/2016 | Podlowski |
| 2016/0181446 A1 | 6/2016 | Kalkanoglu et al. |
| 2016/0225931 A1 | 8/2016 | Heng et al. |
| 2017/0033250 A1 | 2/2017 | Ballif et al. |
| 2017/0077343 A1 | 3/2017 | Morad et al. |
| 2017/0194516 A1 | 7/2017 | Reddy et al. |
| 2017/0194900 A1 | 7/2017 | Erben et al. |
| 2017/0222082 A1 | 8/2017 | Lin et al. |
| 2017/0256661 A1 | 9/2017 | Xu |
| 2017/0323808 A1 | 11/2017 | Gislon et al. |
| 2017/0358699 A1 | 12/2017 | Juliano et al. |
| 2018/0054157 A1 | 2/2018 | Kapla et al. |
| 2018/0166601 A1 | 6/2018 | Inaba |
| 2018/0254738 A1 | 9/2018 | Yang et al. |
| 2018/0316302 A1* | 11/2018 | Okawa .................. H02S 20/25 |
| 2018/0351501 A1 | 12/2018 | Seery et al. |
| 2019/0028055 A1 | 1/2019 | Yang et al. |
| 2019/0260328 A1 | 8/2019 | Nguyen et al. |
| 2019/0393361 A1 | 12/2019 | Lin et al. |
| 2020/0044599 A1 | 2/2020 | Nguyen et al. |
| 2020/0076352 A1 | 3/2020 | Nadimpally et al. |
| 2021/0091712 A1 | 3/2021 | Nguyen et al. |

FOREIGN PATENT DOCUMENTS

| | | | |
|---|---|---|---|
| CN | 102956730 B | 6/2016 | |
| DE | 102007054124 A1 | 5/2009 | |
| EP | 0828036 | 3/1998 | |
| EP | 1058320 A2 | 12/2000 | |
| EP | 1362967 | 11/2003 | |
| EP | 1485547 A1 | 12/2004 | |
| EP | 2051124 A2 | 4/2009 | |
| EP | 2243901 | 10/2010 | |
| EP | 2243901 A2 * | 10/2010 | ......... E04D 13/0445 |
| EP | 2362429 A2 | 8/2011 | |
| EP | 2709160 A1 | 3/2014 | |
| EP | 2784241 | 10/2014 | |
| EP | 2950018 | 12/2015 | |
| GB | 2278618 A | 12/1994 | |
| GB | 2497276 | 6/2013 | |
| JP | 57-141979 A | 9/1982 | |
| JP | 60-20586 A | 2/1985 | |
| JP | 6-140657 A | 5/1994 | |
| JP | 6-264571 A | 9/1994 | |
| JP | 2000-058894 A | 2/2000 | |
| JP | 2000-091610 A | 3/2000 | |
| JP | 2000-216415 A | 8/2000 | |
| JP | 2001012038 A | 1/2001 | |
| JP | 2006144267 A | 6/2006 | |
| JP | 2013-211385 A | 10/2013 | |
| KR | 10-0276185 B1 | 12/2000 | |
| KR | 101162675 B1 | 7/2012 | |
| WO | 03/074812 A1 | 9/2003 | |
| WO | 2008/136872 A2 | 11/2008 | |
| WO | 2009/062106 A1 | 5/2009 | |
| WO | 2009/099418 A2 | 8/2009 | |
| WO | 2009/137347 A2 | 11/2009 | |
| WO | 2010/128375 A2 | 11/2010 | |
| WO | 2011/128757 A1 | 10/2011 | |
| WO | 2013/059441 A1 | 4/2013 | |
| WO | 2013/067541 A1 | 5/2013 | |
| WO | 2013/102181 A1 | 7/2013 | |
| WO | 2014/178180 A1 | 11/2014 | |
| WO | 2015/155356 A1 | 10/2015 | |
| WO | 2016024310 | 2/2016 | |
| WO | 2016/090341 A1 | 6/2016 | |

(56) References Cited

OTHER PUBLICATIONS

International Patent Application No. PCT/US2018/035918 , "Invitation to Pay Additional Fees and Partial Search Report", dated Sep. 12, 2018, 11 pages.
International Patent Application No. PCT/US2018/035924 , "International Search Report and Written Opinion", dated Sep. 12, 2018, 12 pages.
Final Office Action received for U.S. Appl. No. 15/909,181, dated Dec. 20, 2018, 23 pages.
Final Office Action received for U.S. Appl. No. 15/656,794, dated Jul. 29, 2019, 19 pages.
Final Office Action received for U.S. Appl. No. 15/686,064, dated Jul. 28, 2020, 13 pages.
International Preliminary Report on Patentability received for PCT Patent Application No. PCT/US2018/035918, dated Dec. 19, 2019, 11 pages.
International Preliminary Report on Patentability received for PCT Patent Application No. PCT/US2018/035924, dated Dec. 19, 2019, 8 pages.
International Preliminary Report on Patentability received for PCT Patent Application No. PCT/US2018/042418, dated Jan. 30, 2020, 12 pages.
International Search Report and Opinion received for PCT Patent Application No. PCT/US2018/035918, dated Nov. 6, 2018, 15 pages.
International Search Report and Written Opinion received for PCT Patent Application No. PCT/US2018/020508, dated Mar. 4, 2019, 14 pages.
International Search Report and Written Opinion received for PCT Patent Application No. PCT/US2018/042418, dated Nov. 28, 2018, 14 pages.
International Search Report and Written Opinion received for PCT Patent Application No. PCT/US2019/044308, dated Oct. 14, 2019, 9 pages.
Invitation to Pay Additional Fees received for PCT Patent Application No. PCT/US2018/020508, dated Jan. 9, 2019, 9 pages.
Non-Final Office Action received for U.S. Appl. No. 15/686,064, dated Nov. 29, 2019, 13 pages.
Non-Final Office Action received for U.S. Appl. No. 15/900,636, dated Jan. 28, 2020, 16 pages.
Notice of Allowance received for U.S. Appl. No. 15/656,794, dated Mar. 27, 2020, 10 pages.
Notice of Allowance received for U.S. Appl. No. 15/909,181, dated Sep. 10, 2019, 11 pages.
Office Action received for Australian Patent Application No. 2018410566, dated Jul. 9, 2020, 9 pages.
Pre-Interview First Office Action received for U.S. Appl. No. 15/656,794, dated Apr. 16, 2019, 5 pages.
Pre-Interview First Office Action received for U.S. Appl. No. 15/909,181, dated Sep. 18, 2018, 6 pages.
Bulucani et al., "A New Approach: Low Cost Masking Material and Efficient Copper Metallization for Higher Efficiency Silicon Solar Cells", IEEE, 2015, 6 pages.
Fan et al., "Laser Micromachined Wax-Covered Plastic Paper as Both Sputter Deposition Shadow Masks and Deep-Ultraviolet Patterning Masks for Polymethyl Acrylate-Based Microfluidic Systems", vol. 12, No. 4, 2013, pp. 1-6.
Pelisset, "Efficiency of Silicon Thin-Film Photovoltaic Modules with a Front Coloured Glass", Proceedings CISBAT 2011, Jan. 1, 2011, pp. 37-42.
Poole et al., "Recovery Act: Organic Coatings as Encapsulants for Low Cost, High Performance PV Modules", Nov. 16, 2011, 35 pages.
Vyas et al., "An Inorganic/Organic Hybrid Coating for Low Cost Metal Mounted Dye-Sensitized Solar Cells", 223nl ECS Meeting, The Electrochemical Society, 2013, 1 page.
Final Office Action received for U.S. Appl. No. 16/121,457, dated Jan. 21, 2021, 12 pages.
International Preliminary Report on Patentability received for PCT Patent Application No. PCT/US2018/020508, dated Sep. 10, 2020, 11 pages.
Non-Final Office Action received for U.S. Appl. No. 16/121,457, dated Jul. 28, 2020, 10 pages.
Non-Final Office Action received for U.S. Appl. No. 16/050,994, dated Sep. 23, 2020, 11 pages.
Notice of Allowance received for U.S. Appl. No. 15/686,064, dated Dec. 30, 2020, 8 pages.
Notice of Allowance received for U.S. Appl. No. 15/900,636, dated Aug. 6, 2020, 10 pages.
Office Action received for European Patent Application No. 18711759.3, dated Sep. 24, 2020, 4 pages.
Advisory Action received for U.S. Appl. No. 16/121,457, dated Apr. 20, 2021, 6 pages.
Advisory Action received for U.S. Appl. No. 16/121,457, dated May 14, 2021, 4 pages.
Final Office Action received for U.S. Appl. No. 16/050,994, dated Mar. 26, 2021, 13 pages.
Intention to Grant received for European Patent Application No. 18711759.3, dated Feb. 18, 2021, 7 pages.
International Preliminary Report on Patentability received for PCT Patent Application No. PCT/US2019/044308, dated Feb. 11, 2021, 7 pages.
Non-Final Office Action received for U.S. Appl. No. 16/121,457, dated May 18, 2021, 11 pages.
Notice of Acceptance received for Australian Patent Application No. 2018410566, dated Feb. 3, 2021, 3 pages.
Office Action received for Canadian Patent Application No. 3,066,407, dated Jan. 29, 2021, 3 pages.
Office Action received for Canadian Patent Application No. 3,066,410, dated Feb. 9, 2021, 4 pages.
Office Action received for Canadian Patent Application No. 3,066,410, dated May 6, 2021, 3 pages.
Office Action received for European Patent Application No. 18733485.9, dated Mar. 11, 2021, 5 pages.
Office Action received for European Patent Application No. 18733486.7, dated Mar. 12, 2021, 3 pages.
Office Action received for Indian Patent Application No. 201947052632, dated Mar. 31, 2021, 5 pages.
Office Action received for Korean Patent Application No. 10-2020-7000127, dated Mar. 22, 2021, 10 pages (4 pages of English Translation and 6 pages of Official copy).
Office Action received for Korean Patent Application No. 10-2020-7000130, dated Mar. 24, 2021, 10 pages (3 pages of English Translation and 7 pages of Official copy).
Office Action received for Canadian Patent Application No. 3,066,407, dated Nov. 3, 2021, 5 pages.
Office Action received for Korean Patent Application No. 10-2020-7000130, dated Sep. 27, 2021, 8 pages (4 pages of English Translation and 4 pages of Official Copy).

* cited by examiner

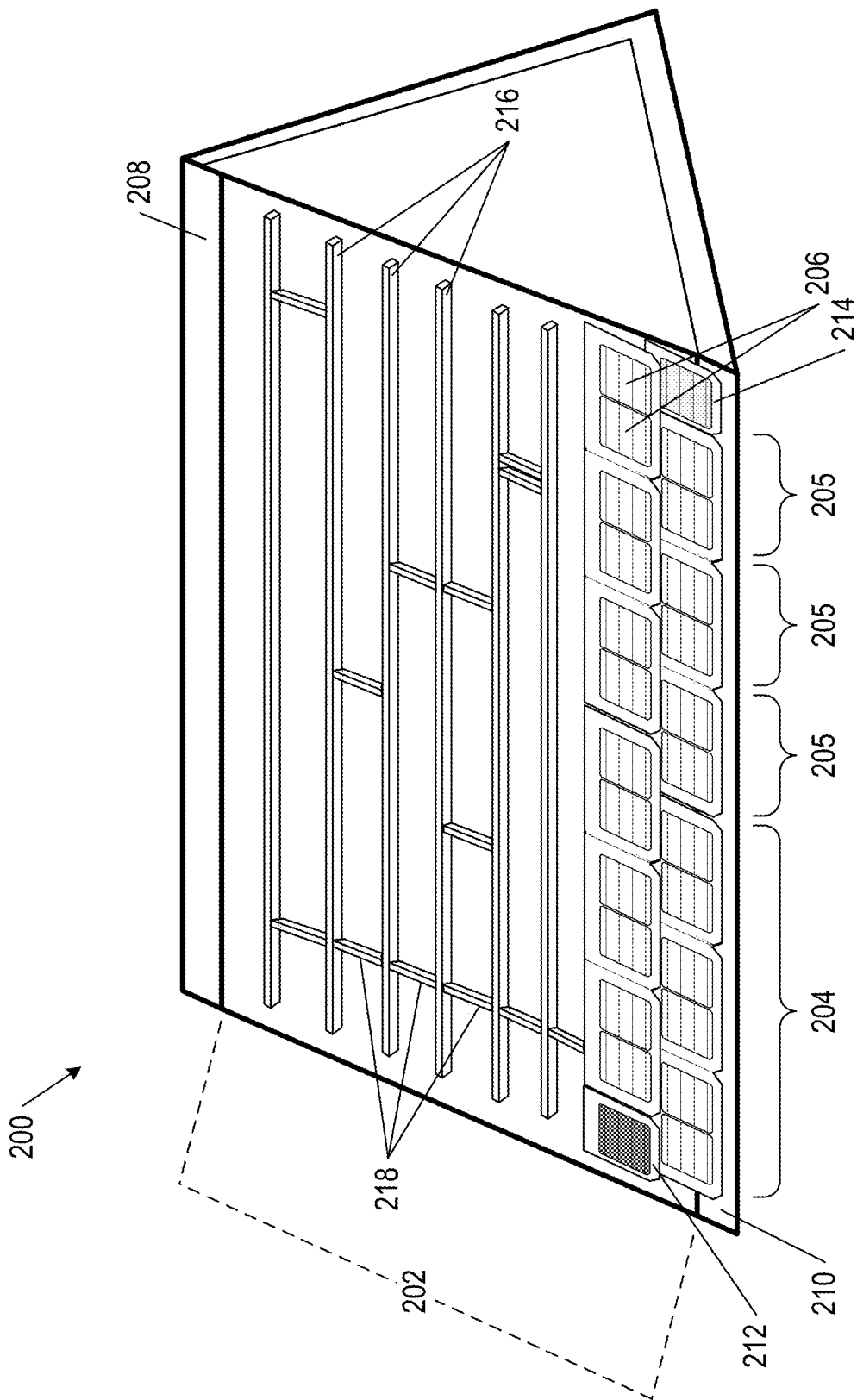

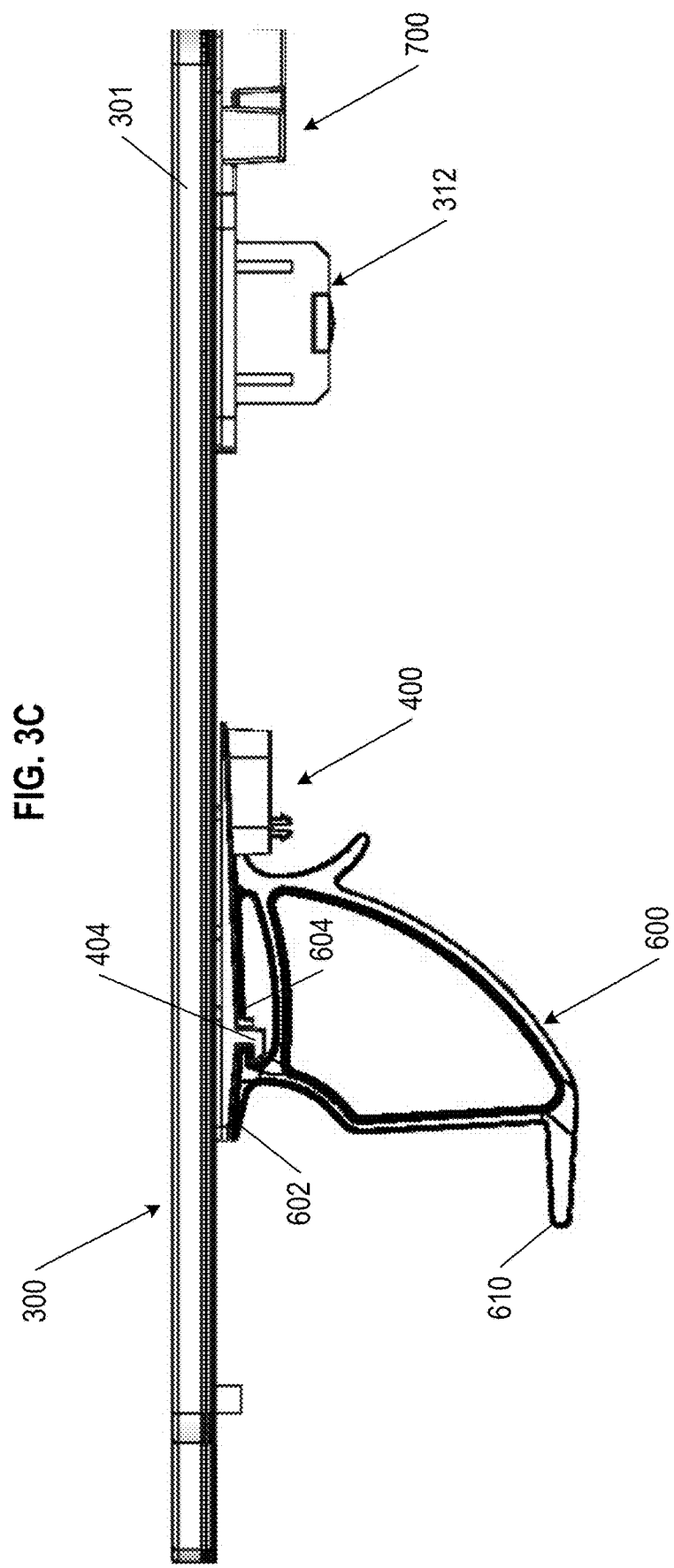

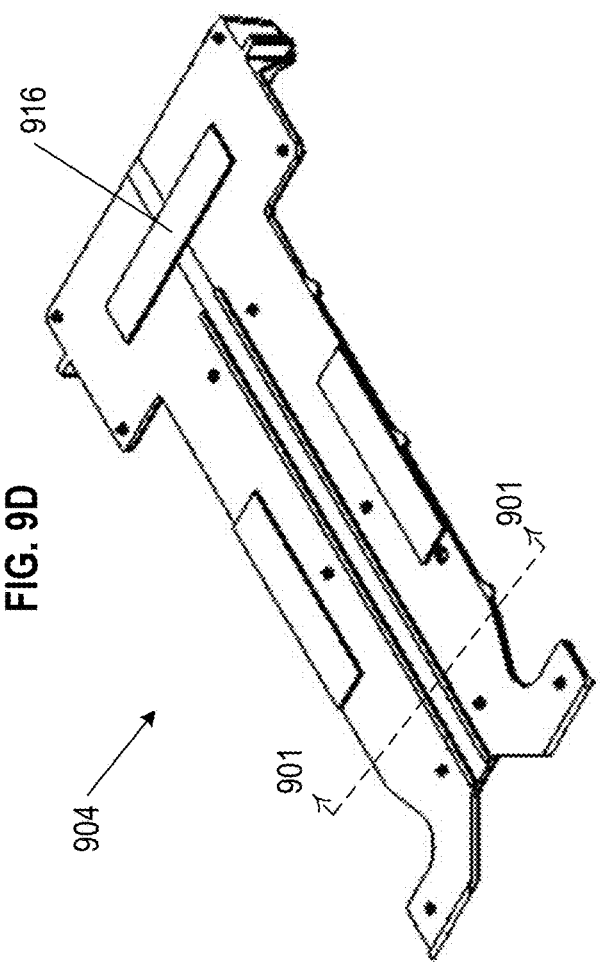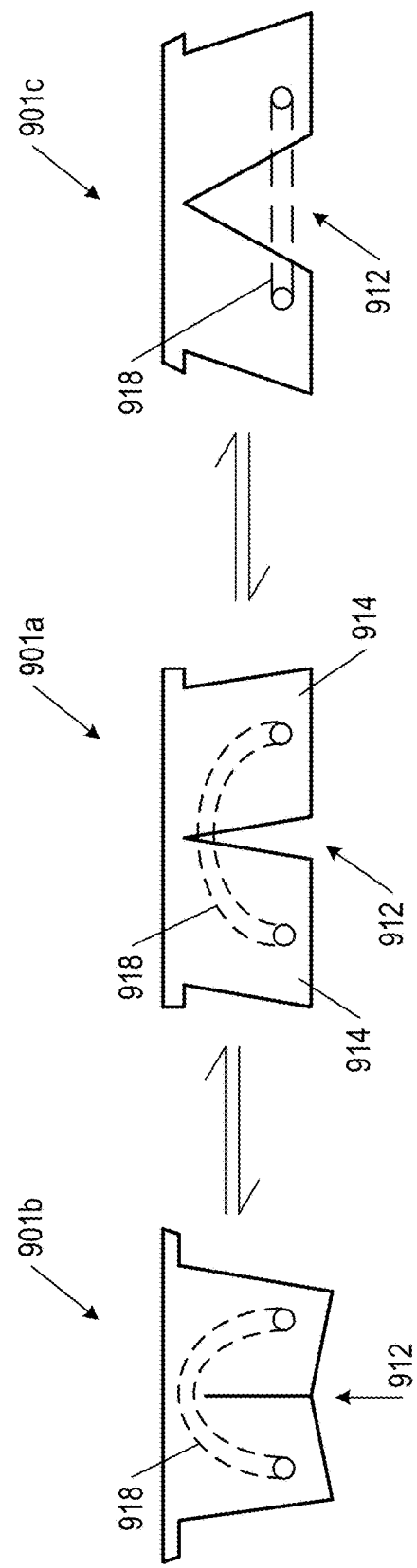

MULTI-REGION SOLAR ROOFING MODULES

CROSS-REFERENCE TO RELATED APPLICATIONS

This application claims priority to U.S. Provisional Application No. 62/515,434, titled "MULTI-REGION SOLAR ROOFING MODULES", filed on Jun. 5, 2017, the entirety of which is herein incorporated by reference. This application is also related to U.S. patent application Ser. No. 15/686,064 (Applicant Reference No.: P367-1NUS), titled "SIDELAP INTERCONNECT FOR SOLAR ROOFING MODULES", filed concurrently with the present application, the entirety of which is herein incorporated by reference

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of fossil fuel-based utility power in most areas, however, solar largely remains a niche product for those who value saving money, reducing $CO_2$ emissions, or both.

One factor that may limit the adoption of solar technology is aesthetics. Most residential solar systems are installed as modules over an existing tile or composition shingle roof. The solar array, which often only covers a portion of the roof, or even a portion of one mounting plane of the roof, stands out as separate and distinct from the existing roof, both in height and material. This difference is therefore visible from the street level and even over large distances.

Further, the time and complexity of a solar array installation can be an obstacle to the adoption of solar technology. Many improvements have been made to streamline and improve the process of installing, mounting, and connecting individual solar panels, but there remains an opportunity for innovating and even better refining the systems and methods of installing different types of photovoltaic arrays.

Another obstacle to solar adoption in existing homes is the dissonance between the age of the existing roof and the solar system, particularly where the existing roof is made from composition shingles. The expected life of a modern-day solar system is 25 years or more, and the expected life of a composition shingle roof is also about 25-35 years, depending on the local climate and specific materials. At the time a customer is considering going solar, their existing roof may be several years, if not decades, into that lifespan. So the customer may be presented with the dilemma of getting a new roof first, increasing the cost of going solar, or installing a 25-year solar system on a roof which may have a relatively shorter remaining operational lifespan.

Accordingly, there is a need to resolve the dissonance between the expected life of the solar system and the remaining life of the roof that also blends in more aesthetically with the complete roof surface or at least the mounting plane, and that does not require the prospective customer to pay for a new roof and a new solar system over that roof.

BRIEF SUMMARY

Various embodiments provide a new and improved approach to installing solar on new roofs and existing roofs, and in particular, presenting a roof that appears to be a tile roof. Some aspects fit over an existing tile roof and/or other suitable roof surfaces (e.g., a metal roof, composite shingle, roof deck, underlayment or insulation layer). In particular, aspects of the invention are modular and flexible, which simplifies installation as well as replacement of individual photovoltaic modules of the system. In addition, some aspects cost less to make and install compared to conventional solar systems. Further, some arrangements of photovoltaic portions (and/or non-photovoltaic portions) of modules can generate a visual pattern and aesthetic that appears consistent with traditional roofing materials. Some solar systems can be installed as a new roof rather than a re-roof or mounted to an existing roof. These and other embodiments are discussed in greater detail in the detailed description and drawing figures.

In some embodiments, the present disclosure is directed toward a multi-region solar or photovoltaic module having a plurality of photovoltaic (PV) elements including: a module frame having lateral sides and longitudinal sides; a first PV region; a second PV region; a third PV region, the first PV region, second PV region, and third PV region being arranged linearly within the module frame, with a spacing zone between each of the PV regions; midlap structures on an underside of the PV module at locations corresponding to the spacing zones between the first PV region and the second PV region and the second PV region and the third PV region; and electrical power connections adapted to electrically connect the PV module with a circuit. In some implementations, the multi-region PV module can also include: track mounting structures coupled to the underside of each PV region of the PV module, the track mounting structures being in alignment along a single axis batten hooks configured to slidably latch within the track mounting structures and, mounted within the track mounting structures, arranged to mechanically secure the module to battens of an underlying roof structure; and offset structures secured to the underside of the PV module, adapted to mechanically couple the module to portions of an underlying roof structure.

In some aspects, the midlap structure of the multi-region PV module can further include: a branched head; a wedge groove, running along a longitudinal axis of the midlap structure, configured to allow for the midlap structure to bend inward until opposing walls of the wedge groove abut each other; and a restraint strap; configured to allow for the midlap structure to bend outward until the restraint strap is taut. In other aspects, multi-region solar modules as disclosed herein can have PV region further include two solar cells, and where the solar cells of each PV region are electrically connected to each other. In further aspects, the multi-region PV module can further include: a fourth PV region, arranged linearly with and adjacent to the third PV region; and a midlap structure on the underside of the PV module at a location corresponding to the spacing zone between the third PV region and the fourth PV region In some aspects, the batten hooks of the multi-region PV modules can be formed to have: a hook body; an upper-fore ledge and an upper-aft ledge positioned opposite of each other at the top of the hook body and forming a rail gap therebetween; and a lower ledge positioned at the bottom of the hook body, extending laterally from the hook body. In other aspects, the track mounting structure of the multi-region PV modules can include a rail, and where the rail is configured to fit in the rail gap between the upper-fore ledge and the upper-aft ledge of the batten hook, such that the batten hook is configured to both slide along the rail and of secure the multi-region PV module on the underlying roof structure.

In other embodiments, the present disclosure is directed toward a building integrated photovoltaic (BIPV) roofing system including: a plurality of multi-region solar modules, where the multi-region solar modules each have an appearance that is similar to three or more individual roofing tiles; a plurality of PV roof tiles; and an underlying roof structure having battens, where courses of a roof envelope are formed by the plurality of multi-region solar modules mounted to the roof structure, where individual members of the plurality of photovoltaic roof tiles are arranged at ends of the courses of the roof envelope, and where the plurality of multi-region solar modules and the plurality of photovoltaic roof tiles are electrically connected to each other to form a solar array. In particular, the individual multi-region solar modules of the plurality of multi-region solar modules can include: a first PV region; a second PV region; a third PV region, the first PV region, second PV region, and third PV region being arranged linearly with each other, with a spacing zone between each of the PV regions; midlap structures on an underside of the PV module at locations corresponding to the spacing zones between the first PV region and the second PV region and the second PV region and the third PV region; and electrical power connections adapted to electrically connect the PV module with a circuit.

In some aspects, each midlap structure includes a branched head; a wedge groove, running along a longitudinal axis of the midlap structure, configured to allow for the midlap structure to bend inward until opposing walls of the wedge groove abut each other; and a restraint strap; configured to allow for the midlap structure to bend outward until the restraint strap is taut. In other aspects, the PV modules also includes: track mounting structures coupled to the underside of each PV region of the PV module, the track mounting structures being in alignment along a single axis, batten hooks configured to slidably latch within the track mounting structures and, mounted within the track mounting structures, arranged to mechanically secure the module to the battens of the underlying roof structure; and offset structures secured to the underside of the PV module, adapted to mechanically couple the module to battens of the underlying roof structure. In further aspects, each of the batten hooks can be formed to have: a hook body; an upper-fore ledge and an upper-aft ledge positioned opposite of each other at the top of the hook body and forming a rail gap therebetween; and a lower ledge positioned at the bottom of the hook body, extending laterally from the hook body. In particular, each track mounting structure can have a rail, where the rail is configured to fit in the rail gap between the upper-fore ledge and the upper-aft ledge of the batten hook, such that the batten hook is configured to both slide along the rail and to secure the multi-region PV module to a batten of on the underlying roof structure. Further, a BIPV roofing system can have individual members of the plurality of photovoltaic roof tiles are arranged in gaps between multi-region solar modules.

In further embodiments, the present disclosure is directed toward a method of assembling a multi-region solar module, including: providing a module with three photovoltaic regions in a linear arrangement, with gap sections between each photovoltaic region; setting two paired, solar cells within each photovoltaic region; electrically and structurally connecting paired solar cells in adjacent photovoltaic regions; attaching a track structure to the underside of each of the three photovoltaic regions, the track structures being in alignment along a single axis, each track structure having a rail; mounting a batten hook onto each rail, each batten hook being slidable along the length of each respective rail; and connecting power outputs to outermost solar cells set within the module. In some aspects, each gap section is about three centimeters wide. In other aspects, the method also includes attaching a midlap structure to the underside of the module at each gap section. In particular, the midlap structure can include: a branched head; a wedge groove, running along a longitudinal axis of the midlap structure, configured to allow for the midlap structure to bend inward until opposing walls of the wedge groove abut each other; and a restraint strap; configured to allow for the midlap structure to bend outward until the restraint strap is taut. In further aspects, the method can also include securing offset structures to the underside of the PV module, the offset structures being adapted to mechanically couple the module to a batten of an underlying roof structure. In some as aspects, each of the batten hooks are formed to have: a hook body; an upper-fore ledge and an upper-aft ledge positioned opposite of each other at the top of the hook body and forming a rail gap therebetween; and a lower ledge positioned at the bottom of the hook body, extending laterally from the hook body.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive

FIG. 2A shows a schematic of a partially-installed building integrated photovoltaic system having multi-region photovoltaic modules, in accordance with aspects of the disclosure.

FIG. 3C shows a cross-sectional side view of an exemplary multi-region photovoltaic module, in accordance with aspects of the disclosure.

FIG. 9D is a schematic illustration of the midlap structure and reversible configurations of the midlap structure, in accordance with aspects of the disclosure.

DETAILED DESCRIPTION

Figure 1A:
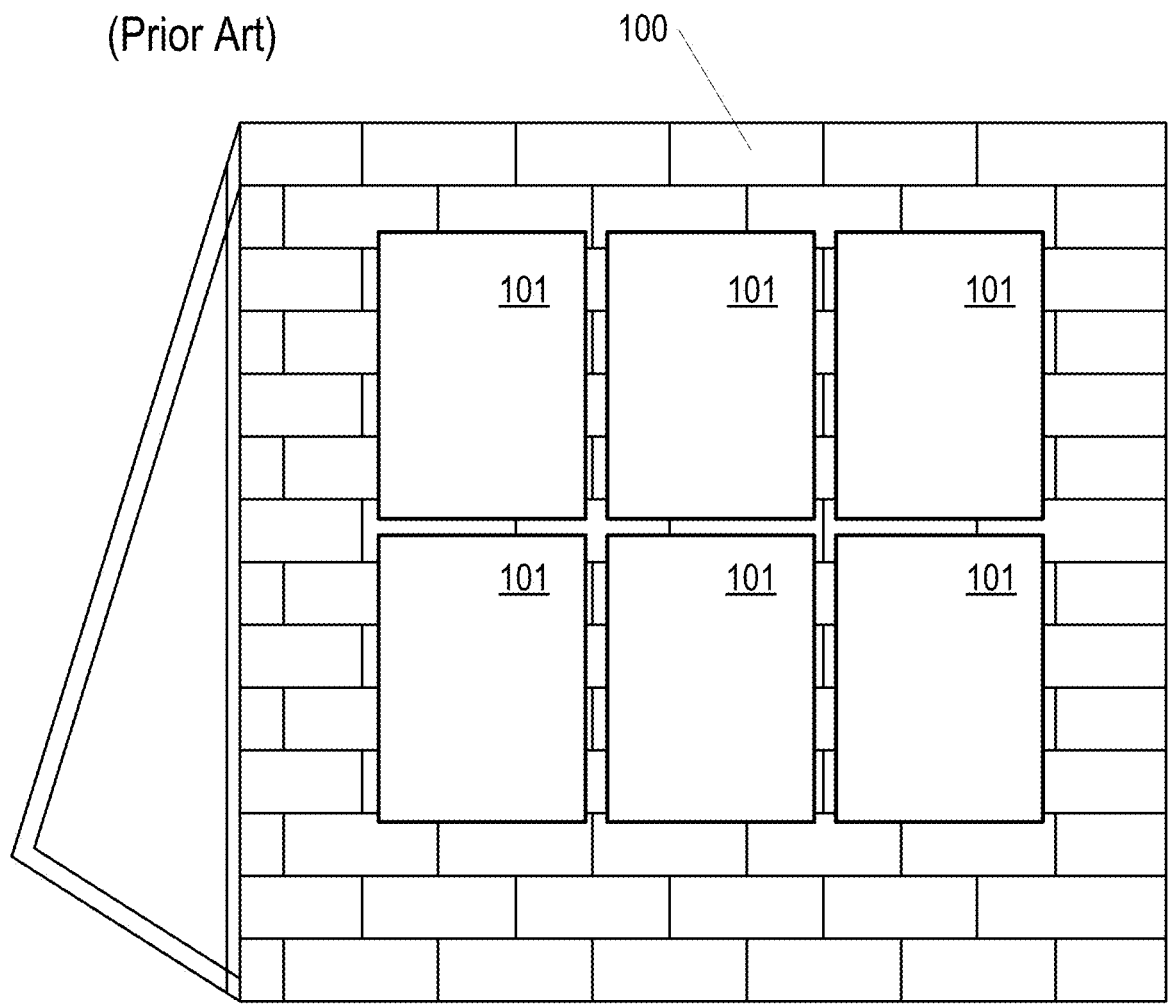
FIG. 1A shows an example of a prior art photovoltaic array installed on a roof.

The present disclosure describes various embodiments of photovoltaic roofing systems and associated systems and methods, and in particular building integrated photovoltaic roofing systems. Some embodiments relate to building integrated photovoltaic module assemblies and associated systems and methods. In various embodiments, the systems described herein lower costs of conventional systems in which a photovoltaic ("PV") system is installed over a roof, and at the same time can provide an improved aesthetic for a PV roof system, and particularly for a building integrated photovoltaic ("BIPV") system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

There is a constant need to improve upon the speed and efficiency of the installation process of PV systems, the visual aesthetic of an installed PV array, as well as the resilience and operational lifetime of PV systems and arrays. Innovations as considered by the present disclosure employ a multi-region PV module, generally spanning a width equal to three PV tiles (or shingles), that provides for a structural component that reduces installation time, is visually appealing, and includes non-rigid features that can improve upon the functional lifespan of each PV module. In particular, the flexibility of the multi-region PV modules disclosed herein allows for an ease of installation due to the slack and ability to adjust the edges of the PV modules as they are being arranged as part of an array, thereby improving upon the installation and assembly process which generally takes less time than assembly of a traditional, rigid PV structure. Further, the multi-region PV module having a form factor equivalent to having three PV tiles built into the module, but distinct from each other and spaced to appear as if they are physically separate, improves the installation time (installing "three PV tiles" at once as opposed to only one at a time) and reduces connector counts over individual roof tiles, while concurrently presenting a visually pleasing roof structure to an average observer. The flexibility of the multi-region PV modules can result in a structure that can better withstand environmental strains (e.g., wind shear, uplift, thermal expansion & contraction, etc.) and uneven roof surfaces due to the range of tilting freedom provided between paired solar cells or PV tiles of the multi-region PV module. Particularly, the multi-region PV modules of the present disclosure have a reinforced flexible region, such that the multi-region PV modules retain the advantages of flexibility for installation and operational lifespan, while controlling the degree of flexibility with reinforcing structures that further protect the spaces between individual regions of the multi-region PV modules from physical wear and stress. Further details of these advantages are discussed below.

Many of the details, dimensions, angles and other features shown in the Figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical, or at least generally similar, elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be ±10% relative to the given value.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Such building integrated photovoltaic structures can be alternatively referred to as building integrable photovoltaic ("BIP") or building applied photovoltaics ("BAPV"). Components of a BIPV system used, in part, as part of the actual building envelope (e.g., roofing membrane), can provide a watertight or substantially watertight seal for the roof surface.

For the sake of distinguishing between structural elements of the present BIPV system, as used herein, the term "solar cell" refers to the structures of the system with solar energy collecting elements, the term "PV roof tile" refers to such solar collecting elements as mounted or adhered to a single structural roof tile, and the term "PV module" refers to a set of solar cells, PV regions of a PV module, and/or other PV units that are mechanically and electrically connected to each other as part of a single structural unit. In the context of a PV module, the term "PV region" refers to sections of the PV modules that can each appear similar to a PV roof tile, and are configured to support solar cells similarly to a single PV roof tile.

As used herein, the terms "up-roof" and "down-roof" are used to provide orientation, direction, position, or a reference point relative to or in context of a roof or roofing surface upon which the systems described herein are installed on and/or from a portion of. Up-roof generally refers to an orientation or portion that is relatively closer to the roof ridge while down-roof refers to an orientation or portion that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (e.g., rotated 90° or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Generally, PV modules include crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting tiles. In some embodiments, PV modules can include layers of amorphous silicon or thin film variations of solar energy-collecting laminates, or thin-film solar materials directly applied as continuous sheets. Generally, PV elements as considered herein, which can include solar cells and laminates, have individual structures that can be used in combination to form larger solar arrays and/or building structures such as PV modules, as set forth below. Alternatively, thin-film PV modules, such as cadmium telluride, copper-indium-gallium-diselenide ("CIGS"), or amorphous thin-film silicon may be used. In still further embodiments, cells based on perovskite or other as of yet non-commercialized materials may be used. The particular type of cell technology used for any given installation can be selected both for solar energy collecting functionality and for aesthetic qualities, as related to the present disclosure.

The present disclosure is directed toward a particular implementation of a multi-region PV module and further toward the assembling of PV arrays on a roof with such modules. In many embodiments, such PV arrays are configured as BIPV roofing systems. In several aspects, the present PV module is formed of three PV regions, each PV region having solar cells mounted therein. The PV regions are generally configured linearly, giving the PV module an elongate shape. It is understood that PV modules as considered herein are not limited to three-PV region embodiments, but rather can also include modules having two, four, or more than four PV regions. Moreover, it should be appreciated that PV or BIPV arrays formed with such PV modules can also include single PV roof tiles deployed in combination with the PV modules, where appropriate for specific spacing, gaps, or edges of the overall PV array. Further, the junction or interface between each of the PV regions of a PV module is constructed to allow for flexibility and a degree of bending between adjacent PV regions, which provides for advantages in assembly and resilience over the lifetime of a PV array installation using such PV modules. In some aspects, the flexibility of PV modules at junctions between PV regions allows the PV modules to follow the contour of an underlying roof surface (which may not be perfectly flat), thereby forming a better fitting and more securely sealed roof envelope. As with standard structural roof tiles, for BIPV implementations, these construction elements are used to form the envelope of a roof, often as part of a re-roofing job replacing an existing roof, for example an original roof that has reached its end-of-life The flexible, multi-region PV module according to the various embodiments of the invention provides for improved ease of construction, as assembling (or disassembling) a PV array with a structural unit three tiles wide is often quicker than assembling a similar PV array one tile at a time. In some alternative embodiments, the modules can have two tiles, four tiles, five tiles, or more than five tiles (all connected in similar fashion as the embodiments described below, and all with similar structural and electrical connection considerations). A BIPV roofing system can use three-tile-width flexible PV modules along with single PV tile components, where the single PV tiles can be placed on the roof at the edges or in locations where a three-tile-width flexible PV module may not fit due to size or arrangement on the underlying roof. The underlying roof structure, in combination with the flexible PV modules and single PV tile components, can form a roof envelope for a BIPV roofing system.

PV elements that are distributed over all roof surfaces can have a visual uniformity that is neat, generally continuous, and elegant. Adjusting the density of PV elements on a roof surface changes both the appearance of the overall roof and the energy production of the solar array on the roof, typically measured in kilowatts (kW) or kilowatt-hours (kWh). Accordingly, the density of PV elements can be adjusted to achieve a desired kilowatt-hour production goal while maintaining an even distribution of the PV elements with a consistent visual aesthetic. In some aspects, PV elements can be distributed on the surface of a roof in a randomized, semi-randomized, or non-regular pattern to achieve the aesthetically pleasing neat, generally continuous, and elegant appearance.

Referring now to the drawing figures, in contrast with embodiments of the present disclosure, FIG. 1A shows an exemplary prior art PV array installed on roof 100. The exemplary PV array of FIG. 1A includes six solar panels 101 or modules which (though not shown in detail) are mounted on roof 100 using one of various known rail-based or rail-free mounting systems, as are currently employed by solar installers, such as Palo Alto, Calif.-based Tesla, Inc. (formerly SolarCity).

Figure 1B:
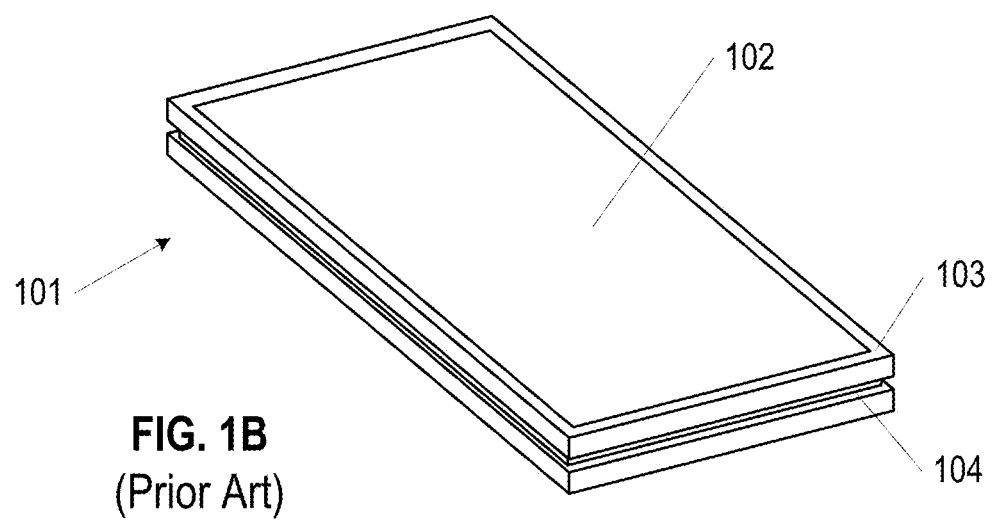
FIG. 1B shows an exemplary prior art photovoltaic module.

FIG. 1B shows one type of conventional solar panel 101 in more detail. Solar panel 101 includes PV laminate 102, which with conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 102. Although shown as a unitary structure in FIG. 1B, laminate 102 may include a plurality of individual solar cells that are wired together to form a single unit under the top glass sheet. In the example shown in FIG. 1B, frame 103 is a grooved frame with groove 104 surrounding the outer face of frame 103 on all sides. Grooved frame modules such as module 101 are manufactured and sold by Tesla, Inc., of Palo Alto, Calif. In such a module, groove 104 serves as mechanism for attaching other mounting hardware (e.g., a leveling foot, an interlock) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal for some would-be customers and have material usage inefficiencies. First, conventional PV systems, such as that shown in FIG. 1A, are typically installed over an existing roof, and not as part of the existing roof, essentially requiring redundant structure since the PV array will shield most of the portion of the roof that it is installed over. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. Alternatively, thin-film solar materials are deposited in continuous sheets and are typically black. The metal frame portion can be painted black to help it blend in with the roof surface, or it can simply be raw aluminum in either case, the contrast between the look of the portion of the roof that is covered with solar panels and the remainder of the roof is generally quite dramatic. This contrast can be particularly jarring when a conventional PV array is mounted on a tile roof because the tile roof will differ not only in color and texture, but also in contour. As a result, roofs that are partially covered with solar panels that can be seen from very far distances due to the relative differences in reflectivity, elevation, height, and/or color between these two very different surfaces.

Multi-Region Solar Module Building Integrated Photovoltaic Arrays

As discussed herein, solar cells that are integrated as part of PV regions, which in turn make up flexible PV modules, can be connected together as and laid down so that they make up the main surface of a roof, and in particular, a solar roof that has the appearance and aesthetic of a uniform tile roof. By having the PV regions individually contain solar cells, because the PV regions form part of the roof through the PV modules, advantages can be obtained in comparison to traditional "over-roof" arrays that are slightly elevated from the surface of a roof. For example, roof surfaces formed of PV modules that are directly built onto the framing structure of a roof can be lighter than over-roof installations, at least because the built-in BIPV solar array does not require a second structure above an existing roof. Further, a roof that is being replaced in a re-roofing installation can replace older or traditional roof tiles with PV modules (and optionally, some PV roof tiles) that may reduce the amount of materials needed for a re-roofing installation. Also, electrical connections, junction boxes, and wiring can be generally housed underneath PV roof tiles or PV modules of such BIPV assemblies, protecting such components from precipitation, wind, and excess heat, and further hiding such components from an observer so as to make the overall BIPV system visually attractive or uniform.

Designers of BIPV solar arrays generally aspire to provide for an advantage over traditional on-roof PV systems by having a less drastic topological difference, thereby reducing visually noticeable differences in height on regions of the roof. However, previous implementations of BIPV systems do not necessarily provide for further visual qualities or designs that effectively minimize noticeable differences between solar materials and standard roofing materials that form the overall PV system in the same manner as the presently disclosed system. In fact, they are typically quite different. Embodiments of the present disclosure provide for a BIPV system, with solar cells contained inside individual tile-like regions within a PV module and electrically connected in strings or other circuits, which is visually appealing at least in that the solar elements and roofing materials are combined and assembled in a layout that minimizes or camouflages the differences between the solar components and the standard construction materials.

A part of the advantage of the present system is that the installation process implements much of the straightforward nature of laying a tile roof, but accounts for PV elements on flexible, multi-region modules (within individual PV regions) and making electrical connections between the solar cells on PV modules, and thus requires only minimal additional work and training. In addition to being faster to install than individual tile modules, having built-in flexibility between individual tile portions in an N-tile portion PV module allows for variations in roof planarity to be compensated for. A rigid PV module composed of N interconnected tile portions would propagate any such variations through the installation and result in a visually uneven installation. A BIPV tile roof as considered herein is mounted in generally the same manner as a standard tile roof, for example: securing and sealing underlayment or other sheathing to frame elements of the roof, adding battens as needed to portions of the roof frame, installing modules and/or tiles to form the main surface of the roof, working around obstacles (e.g., chimneys, skylights, vents, etc.) as needed, and installing ridge and edge tiles in combination with flashing or other trim structures of the roof. Each PV module further includes respective V+ and V− power outputs for connecting to other electrical component of a solar roof. Cell to cell connections are protected internally within the module. In the present system, the PV modules must have a structural integrity capable of accommodating and supporting PV elements within the tile-like regions, in terms of weight, heat generated, ability to connect electronics, and retaining strength to serve as a portion of a roof surface. The modules and tiles used can be of standard sizes as known in the industry. Further, modules and tiles used for systems considered herein can have a wide range of colors to match or blend with PV elements, including, but not limited to, blue, blacks, grays, browns, and natural clay colorations. It is understood that these same advantages can be applied to shingle roofs, with a corresponding PV module shaped to match shingles instead of tile.

In many aspects, embodiments of the present disclosure are directed to multi-region PV modules that have three regions that approximate or are functionally similar to three separate PV tile areas. The sections between each individual region have a flexible structure, to allow for bending of the PV module during installation in or removal from a PV array. As part of a PV array, for example on a roof, rows and courses of such PV modules can look like rows of separate PV roof tiles, and indeed, such an aesthetic is desirable. For flexible multi-region PV modules considered herein having three PV regions, such PV modules can alternatively be referred to as "three-tile" modules, "series triple" modules, or the like.

Figure 2B:
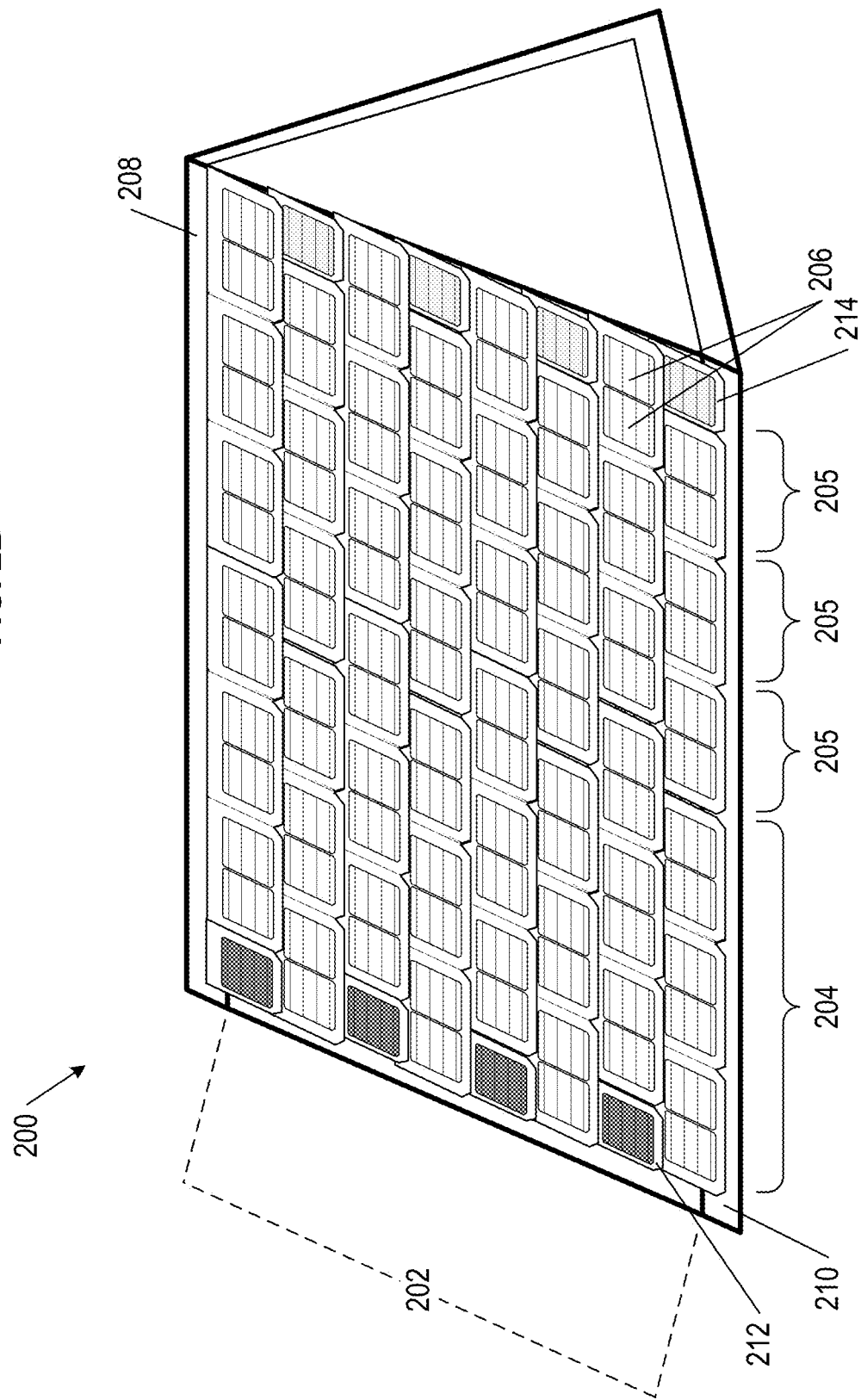
FIG. 2B shows a schematic of a fully-installed building integrated photovoltaic system having multi-region photovoltaic modules, in accordance with aspects of the disclosure.

FIG. 2A shows a schematic of a partially-installed exemplary BIPV system 200 having multi-region PV modules 204, installed in a plane as part of roof surface 202. FIG. 2B shows a schematic of a fully-installed BIPV system 200 having multi-region PV modules 204. BIPV system 200 is arranged from PV modules 204 in horizontal rows or courses along the length of roof surface 202. Each PV module 204 in exemplary BIPV system 200 includes three PV regions 205, where each PV region 205 includes two solar cells 206. Each PV module 204 has an appearance that simulates or replicates the appearance of three individual adjacent PV roof tiles. The separation between PV regions 205 on PV modules 204 and between adjacent modules can mimic the width and appearance of seams or breaks that would exist between adjacent conventional roof tiles. In other words, inter-tile gaps between individual PV regions 205 in PV module 204 may be set to mimic the distance between adjacent PV modules 204 so that the array appears to be composed entirely of individual roof tiles (PV or non-PV roof tiles). Roof surface 202 further includes ridge flashing 208 at the top of roof surface 202 and eave flashing 210 at the bottom of roof surface 202. Flashing 208 may conceal wires and roof/batten connections of the top course of PV modules 204, and also provide for ventilation under the array.

In some embodiments, vertically adjacent courses of PV modules 204 can be offset from each other by half the width of a tile area such that the apparent seams or breaks between two vertically adjacent rows of PV modules 204 do not form the appearance of a single seam or break along the full slope of roof surface 202 as is commonly done with conventional non-solar roof tiles. Rather, the vertically adjacent rows of PV modules 204 can form an alternating pattern of seams, where breaks between adjacent PV modules 204 are relatively equidistant from each other. In alternative embodiments, vertically adjacent courses of PV modules 204 can be offset from each other by one-third the width of a tile area, again such that the apparent seams or breaks between two vertically adjacent rows of PV modules 204 do not form the appearance of a single seam or break along the full slope of roof surface 202 as is commonly done with conventional non-solar roof tiles.

Roof surface 202 can further include other roofing elements, such as standard (traditional, non-PV) roof tiles 212 or individual PV roof tiles 214, which can be used and placed within the overall roof surface 202. In some aspects, individual PV roof tiles 214 can be used to fill gaps between PV modules 204, to finish off ends of rows or courses of PV elements close to the edge of roof surface 202, or to otherwise accommodate and connect portions of a PV array on the roof surface where PV modules 204 do not fit or would not be ideal for BIPV system 200. In other aspects, standard roof tiles 212 can be used to finish off ends of rows or courses of PV elements close to the edge of roof surface 202, to cover spaces between PV elements of the roof surface and flashing or trim components of roof surface 202 (e.g., the most down-roof course of tiles), or for sections of roof surface 202 where the tile needs to be cut to accommodate other roof structures (e.g., vents, chimneys, etc.) and thus cutting PV roof tile 214 or PV module 204 would be an inefficient use of materials. In various embodiments, to speed installation, standard roof tiles 212 may also be formed into N-tile modules, where N is an integer greater than 1.

As shown in FIG. 2A, BIPV system 200 can be installed to form a roof envelope as part of roof surface 202, where PV modules 204 (and optional standard roof tiles 212 and/or PV roof tiles 214) are mounted to battens 216. PV modules 204 (and other roof tiling components) can be mechanically mounted to battens 216 by various hardware connections discussed herein. However, cross-battens 218 (alternatively referred to as "counter-battens") that form part of the roof structure can be positioned at various locations between battens 216, creating physical conflicts with mounting apparatuses that would otherwise mount PV modules 204 to battens 216. Accordingly, as provided herein, mounting structures having a variable or adjustable location on the underside of PV modules 204 allows for secure mounting of PV modules to battens 216, regardless of the regular or irregular placement of cross-battens 218 relative to battens 216.

Several different types of PV modules 204 (and/or PV roof tiles 214) can be used with roof surface 202 as considered herein. PV modules 204 (and/or PV roof tiles 214) can be made of materials including, but not limited to: stone, quartz, slate, granite, ceramics, concrete, porcelain, rigid shingle, clay, glass, onyx, or replica materials for the same. PV modules 204 can have a shape that is generally rectangular, optionally having rounded corners, sharp corners, smooth edges, notches along the edges, in various combinations, and the like. The edges of PV modules 204 can further be beveled, chamfered, rounded, right-angled, or the like. PV modules 204 having one side longer than another side can be oriented either with the longer edge of PV module 204 generally parallel to the width dimension roof surface 202 or with the shorter edge of PV module 204 generally parallel to the width dimension roof surface 202. Generally, PV modules 204 considered for use herein are substantially planar in geometry, but in other embodiments PV modules 204 can be configured to mimic shapes that include, but are not limited to: curved tiles, barrel tiles, s-shaped tiles, Spanish tiles, tiles shaped to be used on the edges of a roof, or tiles shaped to interlock with adjacent tiles. In further alternative embodiments, PV modules 204 can have a size and weight similar to roof shingles and can have a striated or contoured top surface formed directly in the top layer of glass. All PV modules 204 considered herein can be formed with lapping tabs or features extending past the perimeter of the top surface, or without excess trim or material extending from a bottom plane or surface of PV modules 204.

Each PV module 204 as shown in BIPV system 200 shows two solar cells 206 in the "reveal" portion of each PV region 205, effectively spanning the width of each PV module 204, the reveal portion being the section of PV modules 204 that are exposed to sunlight as part of a roofing installation. Generally, an upper or header portion of the top surface of PV modules 204 in BIPV system is a "lapped" or "overlap" region and, as part of a roofing installation, will be physically covered or underneath bottom surfaces of PV modules 204 (or other roofing components) of the next adjacent, up-roof course of PV modules 204.

Solar cells 206 are embedded or adhered to PV modules 204 that are essentially frameless or have a minimized frame structure so that PV modules 204 are both the structural substrate and frame for solar cells 206. In some aspects, solar cells 206 can have electrical contacts in a frame section, such as in a header portion of module 204, but this is optional. In other words, solar cells 206 can be constructed without a rigid frame (e.g., made of metal, plastic) surrounding or enclosing the edges of the PV material, or in some embodiments, surrounding only a portion of the bottom and sides but not the top of solar cell 206. In various embodiments, a module frame that supports PV regions 205 and solar cells 206 can be made from injected molded plastic or other suitable lightweight, durable and electrically insulating material. In some embodiments, solar cells 206 and associated electrical connectors (e.g., bus bars) can formed from silicon layers embedded between transparent polymer layers such as thermoplastic polyolefin (TPO), and further sandwiched between front and backing solar glass plates.

BIPV system 200 shown in FIGS. 2A and 2B include PV modules 204, individual PV roof tiles 214, and standard roof tiles 212 which form a structural envelope for roof surface 202. In the exemplary embodiment, PV roof tiles 214 and standard roof tiles 212 have a width that is roughly one-third of the width of multi-region PV modules 204. Viewed together, these PV modules that form BIPV system 200 reduce the complexity inherent in conventional PV systems installations while providing a uniform look and appearance. BIPV system 200 achieves a combined function of forming structurally sound roof surface 202 as well as a solar energy collecting circuit.

In various implementations, solar energy collecting elements of BIPV system 200 can cover a fraction or percentage of roof surface 202 as appropriate, taking into considerations environmental conditions such as shading, the orientation of the underlying building, the angle and pitch at which roof surface 202 is positioned, or roof features (skylights, pipes, vents, etc.) that may break the place of roof surface 202. In some implementations, PV modules 204 can cover at least 38% of roof surface. In other implementations, PV modules 204 can cover about 50% of roof surface 202. In further implementations, PV modules 204 can cover up to 67% of roof surface 202, or more than 67% of roof surface 202. In various aspects, coverage of roof surface 202 with PV modules 204 (or with solar cells 206) can be from 33% to 67% of roof surface 202, or at any increment or gradient of roof surface 202 area coverage therein.

Other aspects of roof surface 202 can interface with BIPV system 200 to form a functional, water-tight roof. For example, ridge flashing 208 can include a ridge cap at the top of the resultant BIPV array, and may be used for venting, heat dissipation, wire management, and to generally conceal and protect wires (e.g., conduits or cables) or other equipment (e.g., fans, vents, connectors, inverters, jumpers, home-run connections). Waterproofing components, such as liners or trim, can be set underneath or between PV modules, PV tiles, and/or standard roof tiles such that roof surface 202 properly functions as a roof to prevent water from entering the structure of the building. BIPV system 200 can also include other roofing components (e.g., flashings, gutters, vents, caps, covers, trims), for example, at eave flashing 210, hips, valleys, chimneys, dormers, or sides of the roof (not shown).

Figure 2C:
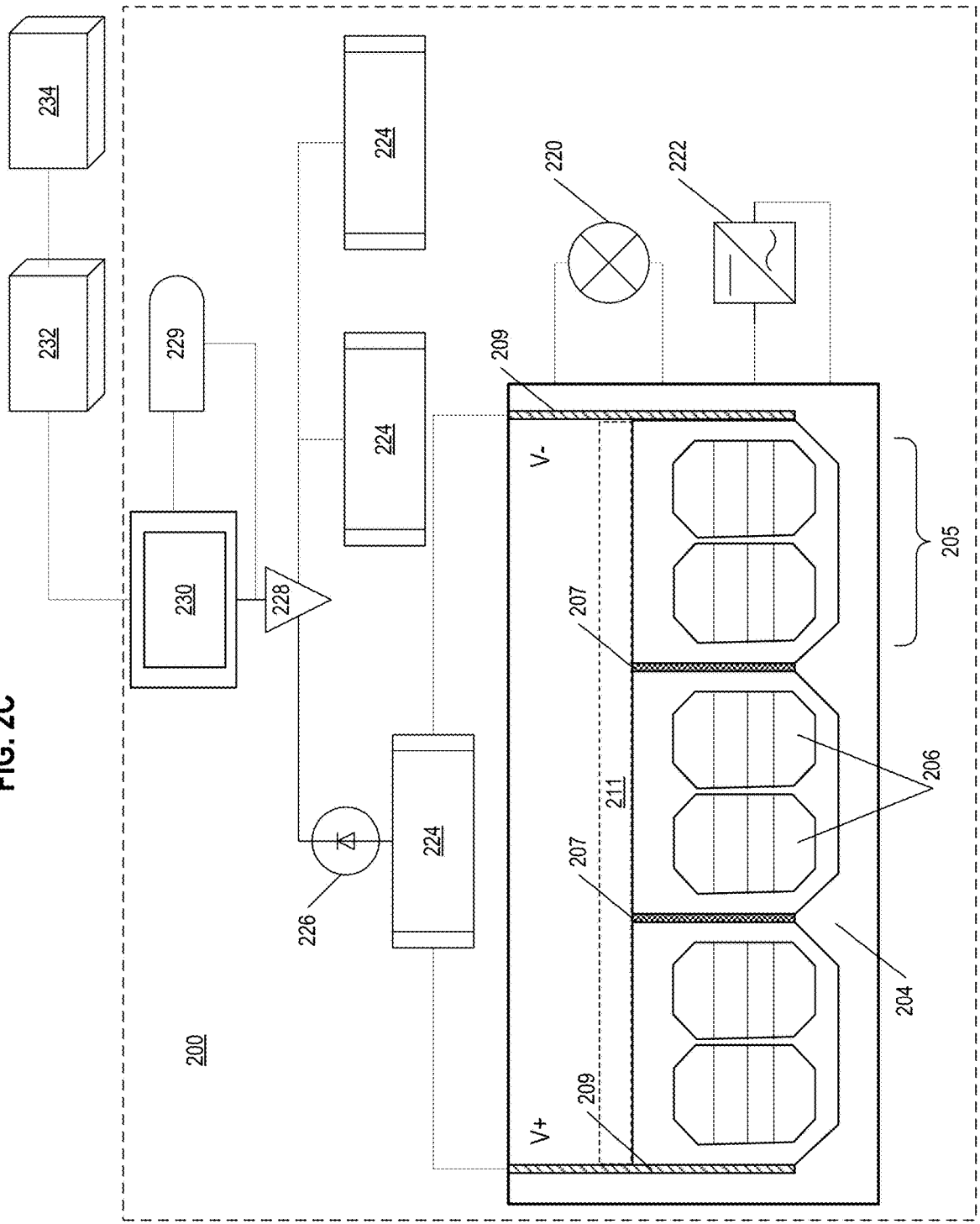
FIG. 2C is a mixed schematic and block diagram, showing connection of an exemplary multi-region photovoltaic module to a power grid output, in accordance with aspects of the disclosure.

FIG. 2C is a mixed schematic and block diagram, showing system 200 with exemplary multi-region PV module 204 connected to a power grid output. Further shown as part of multi-region PV module 204 are gap sections 207 (alternatively referred to as "spacing zones" or "midlap sections") between PV regions 205. In some embodiments, gap sections 207 can be about three centimeters (3 cm) wide. For other embodiments, gap sections 207 can have a width configured to space apart PV regions 205 such that BIPV system 200 has an appearance similar or identical to a roof constructed from individual PV roof tiles 214 and standard roof tiles 212. Thus, in various aspects, gap sections 207 can have a width of from about 1 cm to about 10 cm, or any increment or gradient of length within that range. In further aspects, two gap sections 207 on a single PV module 204, spacing apart three PV regions 205, can be equal in width. Alternatively, in other aspects two gap sections 207 on a single PV module 204, spacing apart three PV regions 205, can have different widths, as appropriate for any given BIPV system installation. Also shown as part of multi-region PV module 204 are outlet bus bars 209, which can electrical connect PV module 204 as part of a series circuit, where outlet bus bars 209 can form respective V+ and V− power outputs.

In other embodiments of PV modules 204, electrical connections between PV 205 regions and solar cells 206 can be located within a header region of PV module 204. In such embodiments, local bus bar(s) 211 or other electrical connections are located or under the overlap region of PV module 204, connecting solar cells 206 to each other across PV modules 204, and further connecting to outlet bus bars 209. In such implementations, gap sections 207 can be complete gaps, without any connecting physical structure directly between PV regions 205. The empty space between PV regions 205 in gap regions 207 can impart greater flexibility, to PV module 204, and/or make PV module 204 easier to bend at gap region 207 locations.

In some aspects, PV modules 204 supporting or embedded with solar cells 206 can be specifically configured to accommodate electrical junction boxes 220 or micro-inverters 222 on each individual PV modules 204, located on the bottom surface (underside) of PV modules 204. Wiring, cables, and/or power buses to electrically connect PV modules 204, and by extension solar cells 206 on within PV regions 205, can string together a plurality of PV modules 204. To avoid interference with underlying studs, rafters, joints, battens, cross-battens, buttresses, or other infrastructure of a roof, such electrical components can be attached to the underside of PV modules 204 in locations to avoid physical conflicts. In combination or alternatively, non-PV roof tiles 210 that do not include electrical connectors or components on their underside can be used in locations where such electrical connectors would otherwise physically conflict with underlying roof infrastructure.

A string of PV modules 204 can be electrically connected together as a subset circuit, referred to as branch 224 to achieve a specific or desired number of solar cells, and corresponding electrical load. Branches 224 can have a specific number of solar cells to build to a desired voltage or kilowatt production. For example, a subset circuit of electrically connected PV modules 204 can have six (6), twelve (12), eighteen (18), twenty-four (24), thirty (30), thirty-six (36), or any incremental number of solar cells within or greater than that numerical range. A string of conventional solar with 60-72 cell modules may contain upwards of 12-15 series connected modules with an aggregate voltage of 600-1000 volts, so a single string or trunk of BIPV modules may include a dozen or more branches of four modules to achieve similar aggregate voltages. These exemplary subset circuits consider configurations with solar cells 206 increasing by multiples of six, due to the exemplary arrangement of three PV regions 205 with two solar cells 206 each on individual multi-region PV modules 204. It should be appreciated, however, that further embodiments could have multi-region PV modules 204 with other number-of-solar-cell embodiments above, below, or within the above-considered increments. For example, a subset circuit can include one or two PV roof tiles with less than six solar cells 206 electrically connected as part of the subset circuit. The various embodiments of strings with different numbers of solar cells allows for flexibility in selecting solar panels appropriate for any given system installation. By extension, branches 224 can alternatively have more solar cells 206 to build to higher voltage and kilowatt levels, for example having 42-cell, 48-cell, 54-cell, 60-cell, 66-cell, 72-cell, 78-cell, or 84-cell embodiments, or other incremental numbers of solar cells therein.

In many embodiments, branches 224 will be formed of one (1), two (2), three (3), or four (4) PV modules, generally connected in series. The number of PV modules 204 used for any given installation of branch 224 can vary in order to reach a target voltage (e.g., 600 V) or to mitigate against overheating at a diode. Branches 224 can connect to diode trunks 226, which can electrically connect all of PV modules 204 forming any given branch 224. Diode trunk 226 houses a bypass diode, which can electrically protect branch 224 to which diode trunk 226 is connected by diverting current as necessary. For example, diode trunk 226 can divert current from branch 224 that is partially shaded, and thus has solar cells 206 that are not generating electricity at a level comparable to other PV modules 204 and branch circuits 224 on roof surface 202. Alternatively, diode trunk 226 can bypass branch 224 that has an open connector (e.g., a break in the electrical connections) within branch 224. Branches 224, each passing through respective diode trunks 226, can further connect to pass-through box 228. Pass-through box 228 allows for the transition of photovoltaic wiring from BIPV roof to wiring in the underlying attic or roof eave. In some implementations, pass-through box 228 can further connect to rapid shutdown device 229 (RSD). RSD 229 can allow for automatic disconnection of PV modules 204 within BIPV system 200 as necessary for safety or electrical load issues.

Multiple branches 224 electrically connected to each other (in series or in parallel, optionally including further components such as minor electrical boxes, inverters, or the like) in combination form solar array 230 as part of roof surface 202, and thus overall BIPV system 200. Electricity generated by solar array 230 and BIPV system 200 can be provided to local electrical grid 232 (e.g., the building on which BIPV system 200 is installed). Electricity generated by solar array 230 and BIPV system 200 can further be provided to public electrical grid 234. Additional circuit components, such as junction boxes or wiring/cable connectors (e.g., MC4 connectors), can also be coupled to branches 224, for control of electrical load into and from local electrical grid 232.

The combination of these elements above for BIPV system 200, primarily using PV modules 204, can provide for an overall roof appearance that is visually pleasing, with minimal points of contrast or sharp edges to distract the eye of an observer. The clear aesthetic advantage includes the fact that roof surface 202 does not look choppy or discontinuous, with a consistent visual appearance.

It should be understood that in these embodiments, roof pitches where such systems are installed are generally non-zero, and that the systems are installed to account for the angle or slope of (non-flat) roofs. The distances or gaps between various tiles, rows, courses, or assemblies thereof, and the degree to which such gaps are concealed will be dependent on roof pitch, the roof dimensions, the distance a viewer is from the roof, and the height of the viewer.

Figure 3A:
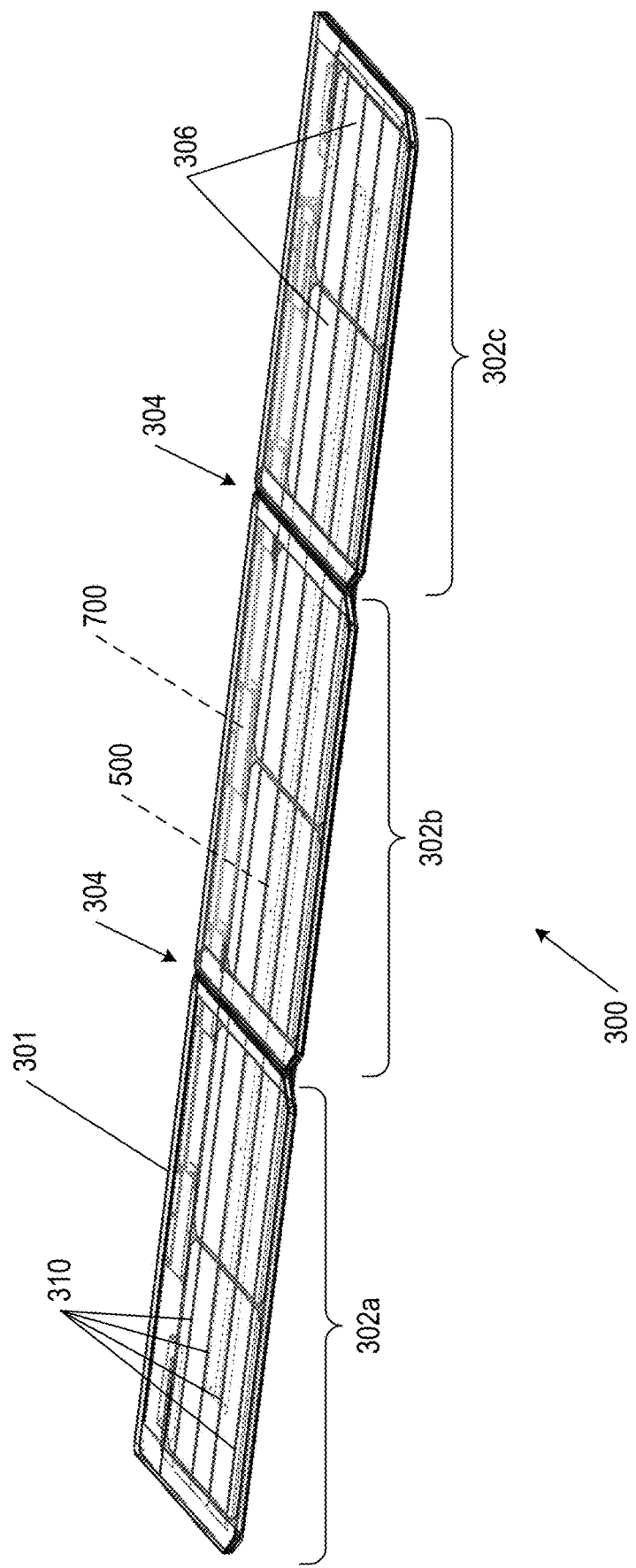
FIG. 3A shows a top surface perspective view of an exemplary multi-region photovoltaic module, having three PV regions, in accordance with aspects of the disclosure.

FIG. 3A shows a top surface view of exemplary multi-region PV module 300, having three PV regions 302a, 302b, and 302c. In various embodiments, module frame 301, supporting PV regions 302a/302b/302c, is made from injected molded plastic or other suitable lightweight, durable and electrically insulating material. Midlap sections 304 are located between PV regions 302a and 302b, as well as between PV regions 302b and 302c. (These PV regions can be generally identified as PV regions 302.) As illustrated, multi-region PV module 300 is semi-transparent, such that structures on the underside of multi-region PV module 300 including mounting tracks 500 and offset structures 700 are also indicated; these elements are described in further detail in FIGS. 3B, 3C, 5, and 7 herein.

In the top surface view of FIG. 3A, first PV region 302a is shown on the left side of multi-region PV module 300, adjacent to second PV region 302b with midlap section 304 in between these PV regions. Similarly, third PV region 302c is shown on the right side of multi-region PV module 300, adjacent to second PV region 302b (and on the opposite side of second PV region 302b as compared with first PV region 302a) with a separate midlap section 304 in between these PV regions. Second PV region 302b can be considered as the center region of multi-region PV module 300. Both midlap sections 304 can connect adjacent pans, PV regions 305, or portions of multi-region PV module 300, and both midlap sections 304 can accommodate the inter-module cell-to-cell electrical connection formed by bus bars 310, or other electrical connections between solar cells 306.

Each PV region 302a/b/c shown in FIG. 3A is configured to receive and support two solar cells 306. Spanning over solar cells 306 are bus bars 310 which provide for greater conductivity across solar cells 306. It should be appreciated that although shingled solar cells are represented in FIG. 3A, various embodiments of the invention may utilize traditional, non-shingled cells or even sections of thin film solar. The various embodiments of the invention are not tied to any particular solar cell technology. As shown in FIG. 3A, bus bars 310 can span across all solar cells 306 within multi-region PV module 300, passing over, underneath, or through midlap sections 304. Bus bars 310 can also connect with bus pars or other electrical connection elements (as shown in FIG. 2C) for joining multi-region PV module 300 to a circuit, to output the power generated and collected by solar cells 306. As shown, each PV region 302 is equal in area, and particularly equal in width, such that PV module 300 has an appearance similar to three individual PV tile components.

Each PV region 302a/b/c is further covered with a separate and discrete glass layer, over each pair of solar cells 306 within each PV region 302. Each PV region 302 having an individual glass layer allows for PV module 300 to be bendable and flexible at spacing zones 304, as opposed to a single glass layer spanning the full width of PV module 300. In various aspects, such glass layers can be integrated as part of solar cells 306, or additional layers disposed above solar cells 306.

Figure 3B:
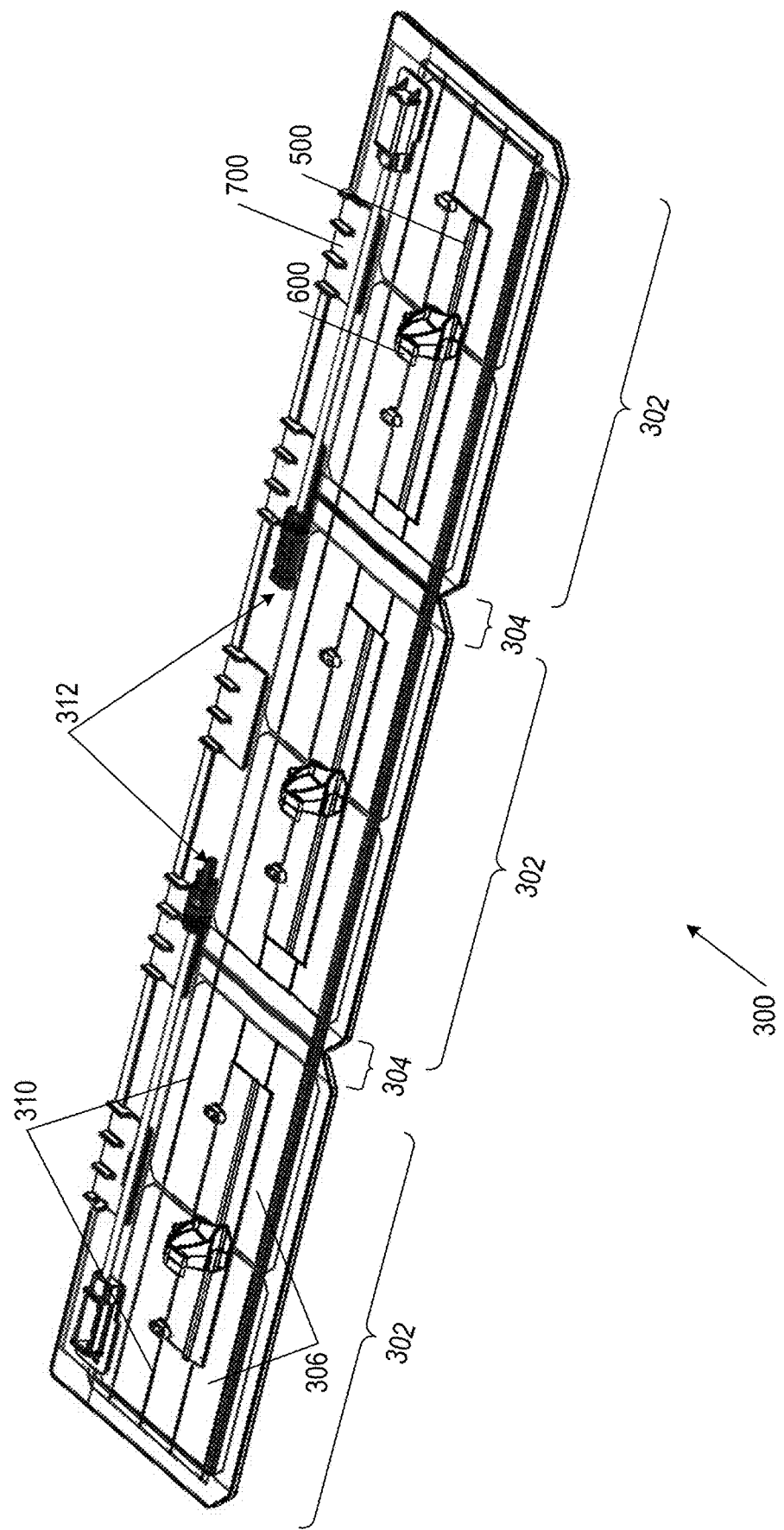
FIG. 3B shows a bottom surface perspective view of an exemplary multi-region photovoltaic module, as shown in FIG. 3A, in accordance with aspects of the disclosure.

FIG. 3B shows a bottom surface view of exemplary multi-region PV module 300, with PV regions 302 and midlap sections 304 therebetween, as also shown in FIG. 3A. Each PV region 302 is shown having mounting track 500 spanning a portion of two solar cells 306 within each respective PV region 302, and with each mounting track 500 having batten hook 600 attached and extending therefrom (described in further detail in FIG. 6, herein). PV module 300 further includes offset structures 700 along the up-roof edge of PV module 300 (i.e., on the underside of PV module 300 below the overlap region of PV module 300), which are arranged to mount or couple with battens supporting the up-roof side of PV module 300 within a BIPV system. Further shown are MC4 module connectors 312 mechanically connecting solar cells 306 in adjacent PV regions 302. As shown here, in some aspects, module connectors 312 are in a shipping and transport configuration. In an installation, electrical leads are pulled out of module connectors 312 and respective wire gatherers holding the wires in place for transport, and then connected to respective V− and V+ reciprocal connectors on adjacent modules. In alternative aspects, module connectors 312 can also be wiring junctions between regions of a module or across separate modules that provide for electrical connections between solar cells 306 in combination along with or alternatively to bus bars 310 along solar cells 306. Module connectors 312 can lend structural support and stability to PV module 300, as well as provide for a connection point(s) for power output from PV module 300 to a string, subset circuit, or other portion of a solar array or BIPV system that PV module 300 is a part of. Each module connector 312, however, is also arranged to accommodate a degree of bending and flexibility of PV module 300 at midlap sections 304, where the anchoring of module connector 312 to the underside of PV module 300 can be slidable or where module connector 312 can be constructed with some telescoping tolerance. (Midlap structures can be seen in further detail in FIGS. 9A-9D, below.)

Each section of mounting track 500 as shown is positioned within the area of one PV region 302, not spanning across midlap sections 304, and thereby allowing for a degree of flexibility between PV regions 302, dependent on the material forming midlap sections 304 and the shape of midlap sections 304. Accordingly, batten hooks 600 can be attached to each mounting track 500 (e.g., one batten hook for each of the three mounting tracks on a single PV module) allowing for each PV region 302 to be individually secured to an underlying batten of a roof. In alternative embodiments, PV module 300 can have only one or two mounting tracks 500, underneath specific PV regions 302 as appropriate for a given installation on a roof. In some aspects, each mounting track 500 is paired with one batten hook 600, while in other aspects, any given mounting track 500 can accommodate two or more batten hooks 600. In other alternative embodiments, mounting track 500 can span across more than on PV region 302 on the underside of PV module 300, where mounting track 500 can be relatively rigid or flexible to control for the overall flexibility of multi-region PV module 300.

FIG. 3C shows a cross-sectional view of an exemplary multi-region photovoltaic module. Similarly to FIGS. 3A and 3B, FIG. 3C includes multi-region PV module 300 having offset structure 700, batten hook 600, and module connector 312 coupled to the underside of multi-region PV module 300. FIG. 3C shows alternative mounting track 400, described in further detail in FIG. 4 herein. Similarly to FIG. 3B, mounting track 400 can be positioned on the underside of PV module 300 under each PV region 302, with a respective batten hook 600 attached thereto. More clearly seen in FIG. 3C are rail 404 of mounting track 400, coupled to upper-fore ledge 602 and upper-aft ledge 604 of batten hook 600. The frictional interface between rail 404 and the paired upper-fore ledge 602 and upper-aft ledge 604 has a coefficient of friction sufficient to allow batten hook 600 to slide along rail 404, and thereby allow for the adjustment of batten hook 600 position on mounting track 400 relative to underlying battens of a roof. The coefficient of friction between rail 404 and the paired upper-fore ledge 602 and upper-aft ledge 604 is also sufficient to ensure a secure fit such that batten hook 600 does not slide unintentionally when batten hook 600 is coupled to a batten and supporting PV module 300 on the roof structure. The body of batten hook 600 extends downward away from the underside of PV module 300, and on one side of batten hook 600 lower ledge 610 extends laterally so as to form the hook shape that can couple with a batten or other support element of a roof structure. In other embodiments, PV module 300 can further include a sidelap structure at its lateral edges (not shown), to aid in supporting the overall structure and mounting of PV module 300.

Figure 4:
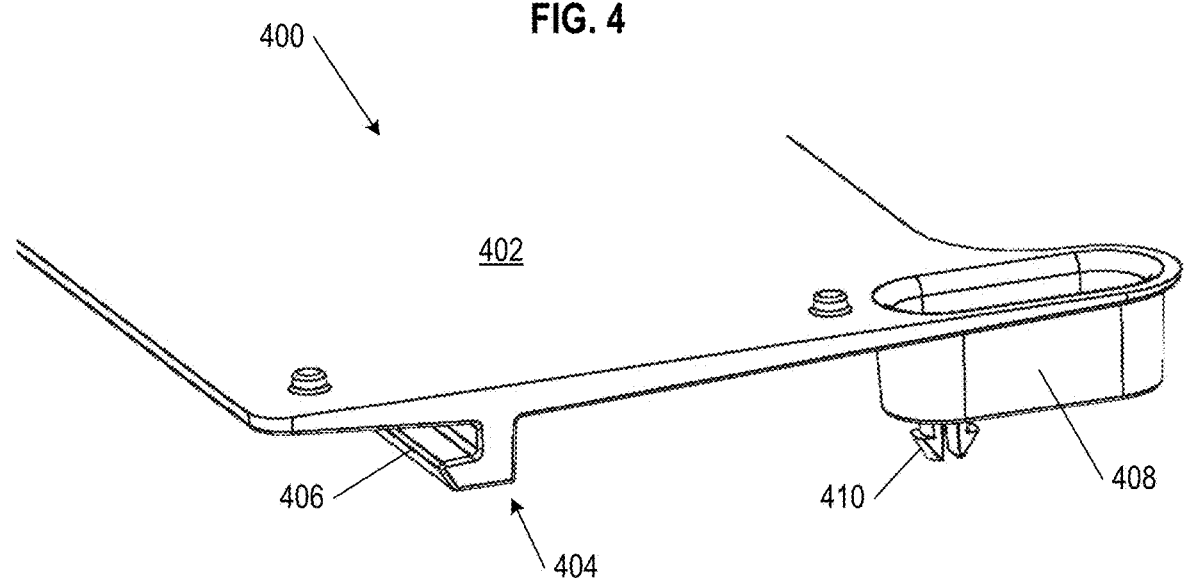
FIG. 4 shows a first exemplary track for mounting a batten hook to the underside of a multi-region photovoltaic module, in accordance with aspects of the disclosure.

FIG. 4 shows first exemplary structure for mounting track 400 for mounting batten hooks 600 to the underside of multi-region PV modules 300. Upper surface 402 of track structure 400 is substantially planar and configured to be attached or adhered to the underside of multi-region PV modules 300. Rail 404 extends downward from the underside of track structure 400, having rail ledge 406 projecting perpendicularly to rail 404 (and generally parallel to upper surface 402), providing physical structure for batten hook 600 or other mounting components to mechanically couple with. Mounting components such as batten hook 600, when coupled to mounting track 400, can slide along rail 404 such that batten hook 600 can be positioned adjacent to, and attach to, a batten of a roof within a movement range defined by the length of rail 404. The movement range of rail 404 thereby allows for batten hook 600 to be slide-adjustable, avoiding physical conflicts with other components of a roof (e.g., cross-battens, electrical boxes, HVAC structures, etc.) while still providing mounting support for PV module 300 at the desired location as part of a BIPV system.

FIG. 4 further illustrates recess 408 and prong 410. Recess 408 and prong 410 can be used to align mounting tracks 400 for stacking with each other, particularly stacking mounting tracks 400 to minimize the volume and profile of these components for transport.

Mounting track 400 can be physically secured to PV module 300 by a mechanical structure (e.g., nuts and bolts) or by adhering upper surface 402 to PV module 300 with a glue, epoxy, or the like.

Figure 5:
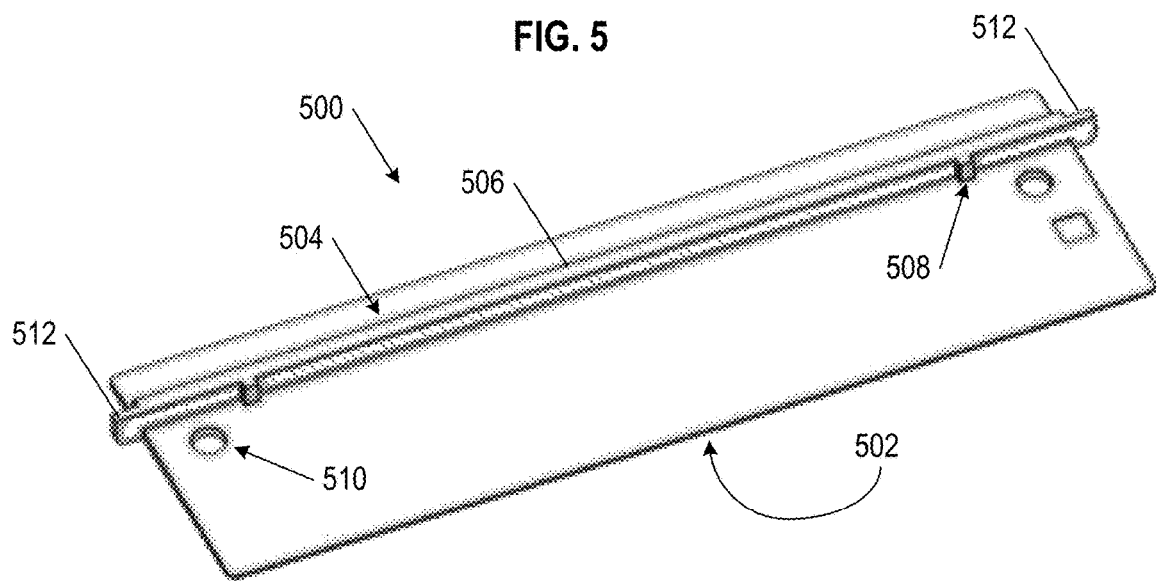
FIG. 5 shows a second exemplary track for mounting a batten hook to the underside of a multi-region photovoltaic module, in accordance with aspects of the disclosure.

FIG. 5 shows second exemplary structure for mounting track 500 for mounting batten hooks 600 to the underside of multi-region PV modules 300. Upper surface 502 (on the opposite side of FIG. 5 as shown) of track structure 500 is substantially planar and configured to be attached or adhered to the underside of multi-region PV modules 300. Rail 504 extends downward from the underside of track structure 500, having rail ledge 506 projecting perpendicularly to rail 504 (and generally parallel to upper surface 502), providing physical structure for batten hook 600 or other mounting components to mechanically couple with. Mounting components such as batten hook 600, when coupled to mounting track 500, can slide along rail 504 such that batten hook 600 can be positioned adjacent to, and attach to, a batten of a roof within a movement range defined by the length of rail 504. The movement range of rail 504 thereby allows for batten hook 600 to be slide-adjustable, avoiding physical conflicts with other components of a roof (e.g., cross-battens, electrical boxes, HVAC structures, etc.) while still providing mounting support for PV module 300 at the desired location as part of a BIPV system.

Mounting track 500 includes guide holes 510 open through the body of mounting track 500, configured to accommodate mounting hardware such as bolts, screws, or the like, which can be used to attach mounting track 500 to PV module 300, or which can be used to secure other roof structures with hardware passing through mounting track 500. Guide hole 510 can also aid in alignment of mounting track 500 to a corresponding position on the underside of PV module 300. Mounting track 500 further includes guide tabs 512 that extend past the edges of the main body of mounting track 500. Guide tabs 512 can facilitate alignment of mounting track 500 for installation, and/or to a corresponding position on the underside of PV module 300. Guide tabs 512 can also improve stacking configurations for transport of mounting tracks 500, and also are amenable to formation through injection molding. In some aspects, guide tabs 512 can be formed from portions of rail 504 that do not include rail ledge 506. In other aspects, guide tabs 512 can partially extend from upper surface 502 and fit with a matching groove or space within the underside of PV module 300. In further aspects, multi-region PV module 300 having two or more mounting tracks 500 can have grooves or spaces configured to receive guide tabs 512 and to align mounting tracks 500 relative to each other across separate PV regions 302 of PV module 300. In other words, mounting tracks 500 (or mounting tracks 400) can be secured to the underside of multi-region PV module 300 aligned along a single axis spanning across the multiple PV regions 302, but as discontinuous and separate mounting tracks 500.

Mounting track 500 can be physically secured to PV module 300 by a mechanical structure (e.g., nuts and bolts) or by adhering upper surface 502 to PV module 300 with a glue, epoxy, or the like.

Figure 6:
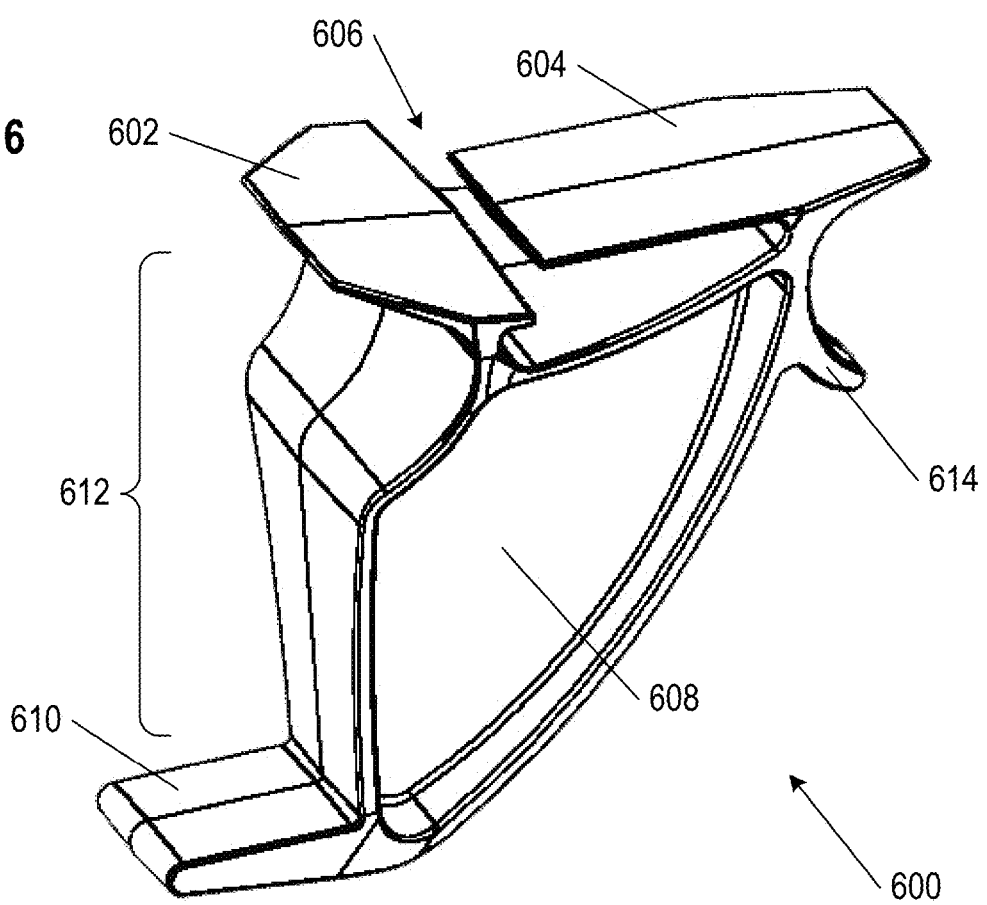
FIG. 6 shows an exemplary batten hook for mounting a multi-region photovoltaic module, in accordance with aspects of the disclosure.

FIG. 6 shows exemplary batten hook 600 for mounting a multi-region photovoltaic module to a batten. Batten hook 600 is configured to mechanically couple with a track structure (e.g., mounting track 400 or mounting track 500), and particularly to securely attach to a rail of a track structure. Batten hook 600 has upper-fore ledge 602 and upper-aft ledge 604 arranged at the top of batten hook 600, forming rail gap 606 therebetween. The size of rail gap 606 can be set to match the width of a rail of a mounting track, such that frictional interface between the mounting track rail and the paired upper-fore ledge 602 and upper-aft ledge 604 has a coefficient of friction sufficient to (i) allow batten hook 600 to slide along the rail and thereby allow for the manual adjustment of batten hook 600 position on a respective mounting track relative to underlying battens of a roof, yet also (ii) ensure a secure fit such that batten hook 600 does not slide unintentionally when batten hook 600 is coupled to a batten and supporting PV module 300 on the roof structure.

Batten hook 600 includes hook body 608 which extends downward from upper-fore ledge 602 and upper-aft ledge 604, having lower ledge 610 at the bottom of hook body 608. Both lower ledge 610 and upper-fore ledge 602 can extend from hook body 608 in the same direction, generally perpendicular to the height of batten hook 600. The space between lower ledge 610 and upper-fore ledge 602 can be referred to as gripping region 612. Gripping region 612 is configured to match, couple with, and secure to the batten of a roof structure. Some portions of batten hook 600 within gripping region 612 can be flush with a batten when coupled together, while other portions of batten hook 600 within gripping region 612 can be close to, but not in contact with a batten when coupled together.

Installing PV module having one or more batten hooks 600 coupled to mounting track 500 and extending from the underside of PV module 300 can take advantage of gravity and the natural slope of an underlying roof. In particular, PV module 300 can be positioned slightly up-roof from the desired location of PV module 300 within a course of roofing elements such that batten hook 600 is also up-roof of the batten to which it will couple. PV module 300 is set such that lower ledge 610 of batten hook 600 is lower than the bottom surface of the batten to which batten hook 600 will couple. PV module 300 is allowed to slide in a down-roof direction, such that gripping region 612 contacts and stops against the up-roof facing surface of the relevant batten. Accordingly, gravity can hold PV module 300 in place on the underlying roof, with the weight of PV module 300 carried by battens via gripping regions 612 adjacent to those battens. Lower ledges 610 of batten hooks 600, adjacent to and in contact with bottom sides of the battens, can further prevent wind updrafts from lifting PV modules 300 off of the battens. Removal of PV module 300 can be accomplished by reversal of the process, sliding PV module in the up-roof direction, such that lower ledge 610 clears the batten on which batten hook 600 was resting, and then lifting PV module 300 up off of the underlying roof.

In some embodiments, batten hook 600 is a generally rigid piece that is not constructed to have a functional degree of flexibility. In other embodiments, batten hook 600 can be made of a slightly flexible or spring-like material, such that batten hook 600 can bend or flex such that gripping region 612 can fit around a batten, and then restorably return to a default shape. Further, portions of batten hook 600 and hook body 608 can be curved so as to provide for regions that can bend or flex during the mounting or installation process without significant hysteresis. In various aspects, batten hooks 600 can be formed of metals, alloys, plastics, other suitable polymer materials, or combinations thereof. Batten hooks 600 can be formed by molding processes, casting processes, 3D printing processes, die cutting, or the like.

Batten hook 600 can further include finger grip 614, extending from hook body 608 on the side opposite of gripping region 612. With slightly flexible versions of batten hook 600, finger grip 614 can be used by an installer during mounting installation or removal to apply force to hook body 608 to partially and temporarily deform the shape of batten hook 608 such that the distance between lower ledge 610 and upper-fore ledge 602 move slightly further away from each other, thereby increasing the length of gripping region 612 and allowing for coupling of batten hook 600 to a batten, or decoupling of batten hook 600 from a batten. It should be appreciated that gripping region 612 of batten hook 600 can be adapted to substantially fit around one side of a batten, without portions of batten hook 600 extending past the full width of a batten.

Figure 7:
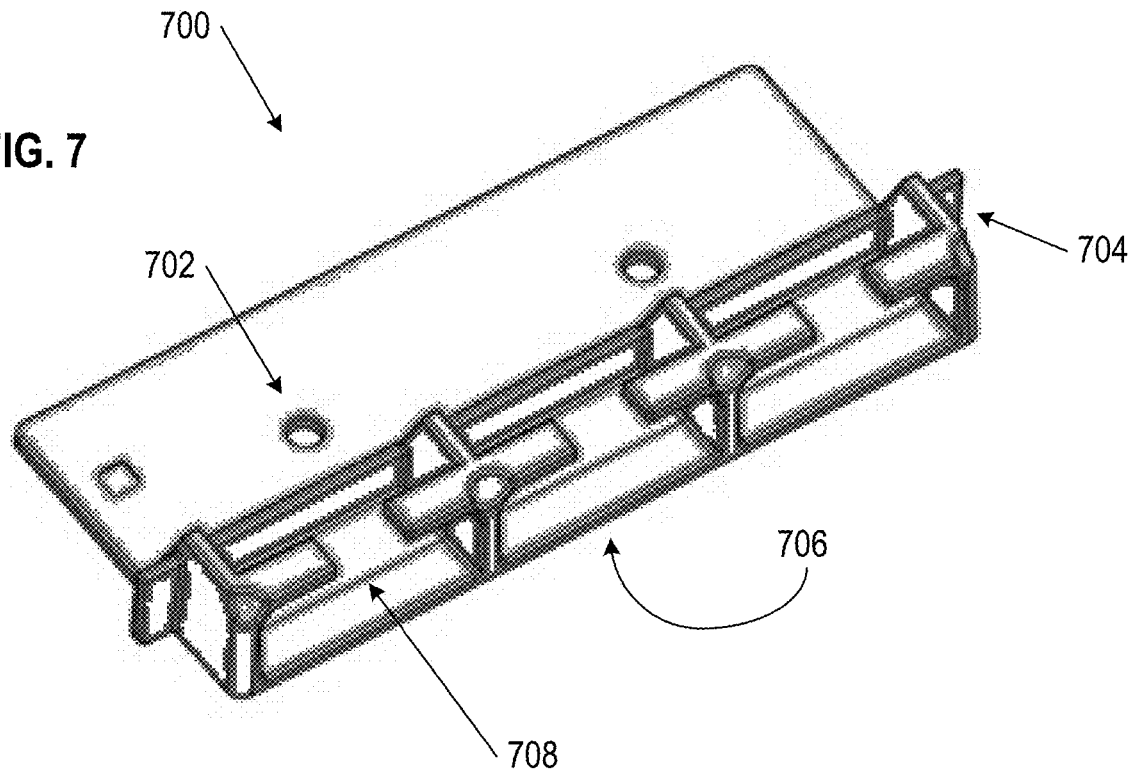
FIG. 7 shows an exemplary offset for mounting to the underside of a multi-region photovoltaic module, in accordance with aspects of the disclosure.

FIG. 7 shows exemplary offset structure 700 for mounting to the underside of a multi-region photovoltaic module.

Offset structure 700 can be molded to have guide holes 702 for securing to an underlying roof batten, roof deck, or other support structure, through which hardware (e.g. bolts, screws) can pass through and physically hold offset structure 700 to a batten. Offset structure 700 can further include guide tabs 712 that extend past the edges of the main body of offset structure 700. Guide tabs 712 can facilitate alignment of offset structure 700 for installation, and/or to a corresponding position on a batten. Guide tabs 712 can also improve stacking configurations for transport of offset structure 700, and also are amenable to formation through injection molding.

Offset structure 700 includes underside surface 706 which, when installed, is in contact with a batten or other roof surface support structure. In some aspects, on underside surface 706 of offset structure 700, an adhesive, glue, epoxy, or the like can be used to secure offset structure 700 to a batten. Offset structure 700 can also include cavities 708, where cavities can included dedicated spaces and optionally tabs or flanges that aid in wire management; in other words, cavities 708 can accommodate slack sections of wiring so that such wiring does not hang loose beneath a PV module.

Figure 8:
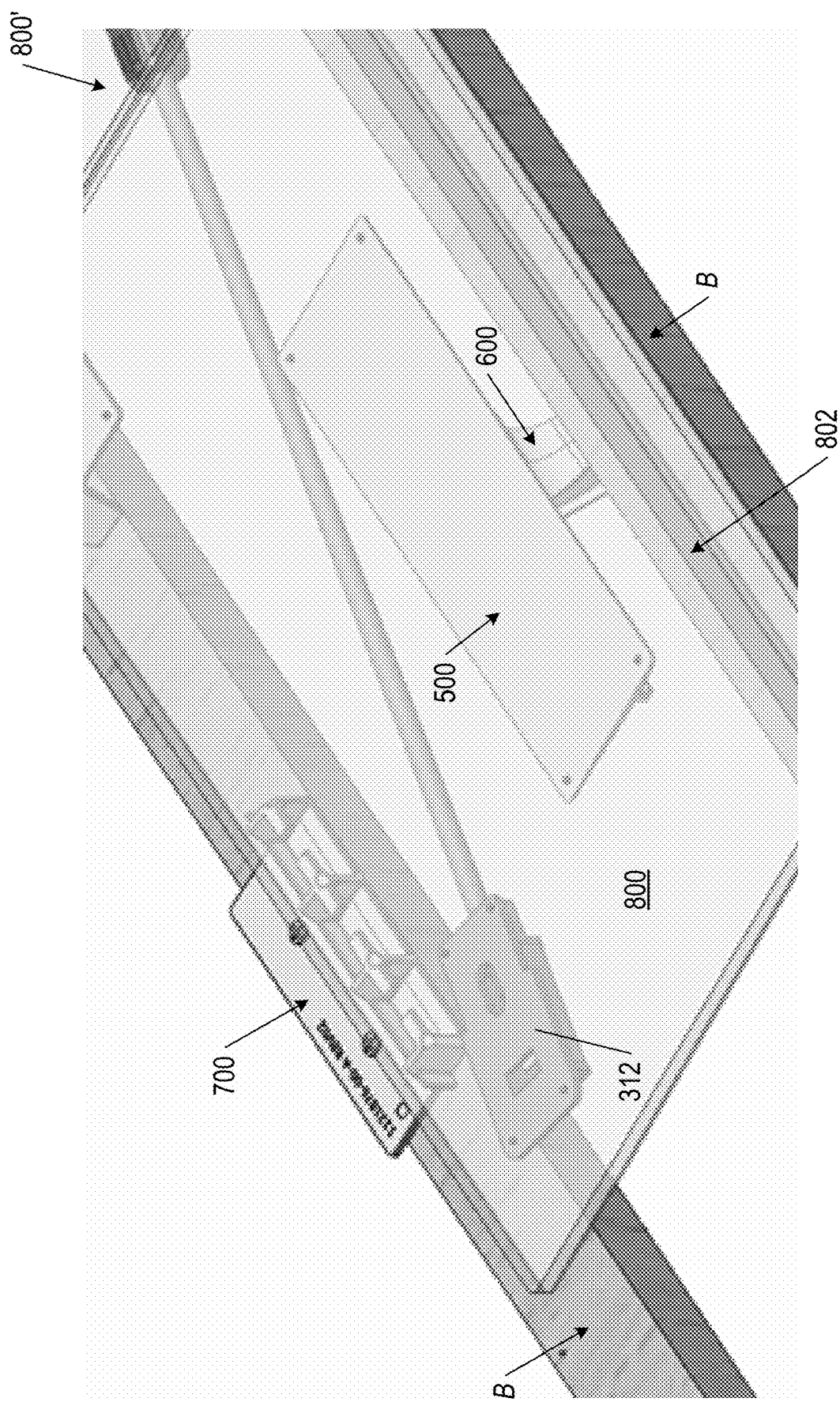
FIG. 8 is an illustration of a PV glass mounted to battens of a roof, having an offset, track, and batten hook, in accordance with aspects of the disclosure.

FIG. 8 is an illustration of assembly 800, having (transparent) PV glass 800 mounted to battens B of a roof, having offset 700, mounting track 500, and batten hook 600. Also shown is module connector 312 spanning from the underside of PV glass 800 to adjacent PV glass 800'. (For the sake of clarity in illustrating these components in FIG. 8, solar cells and other part of PV modules are not shown here.) In various aspects, PV glass 800 can be textured or smooth, as appropriate, to have a visual appearance and aesthetic that is similar to a traditional roofing tile or slate. As shown, mounting track 500 is adhered to PV glass 800, and is not mechanically secured to PV glass 800 using additional hardware. Gasket 802 can be positioned between the underside of PV glass 800 and the respective batten B under the reveal portion of PV glass 800.

It should be appreciated that the down-roof (reveal) portion of PV glass 800 (and a corresponding PV module), has batten hook 600 fitting onto the batten B, with lower ledge 610 gripping the bottom side of the batten. Thus, via track mounting track 500, PV glass 800 (and that region of PV module 300) is mounted and held in place as part of the overall roof structure. Offset structure 700 elevates the up-roof (overlap) portion of PV glass 800 such that there is space underneath PV glass 800 module for additional structures and wiring, such as module connector 312. Further, the elevation of the up-roof portion of PV glass 800 (and by extension, PV module 300) also maintains a consistent plane and/or slope for PV modules mounted to the battens B, as viewed by an observer along the slope of the overall roof.

Figure 9A:
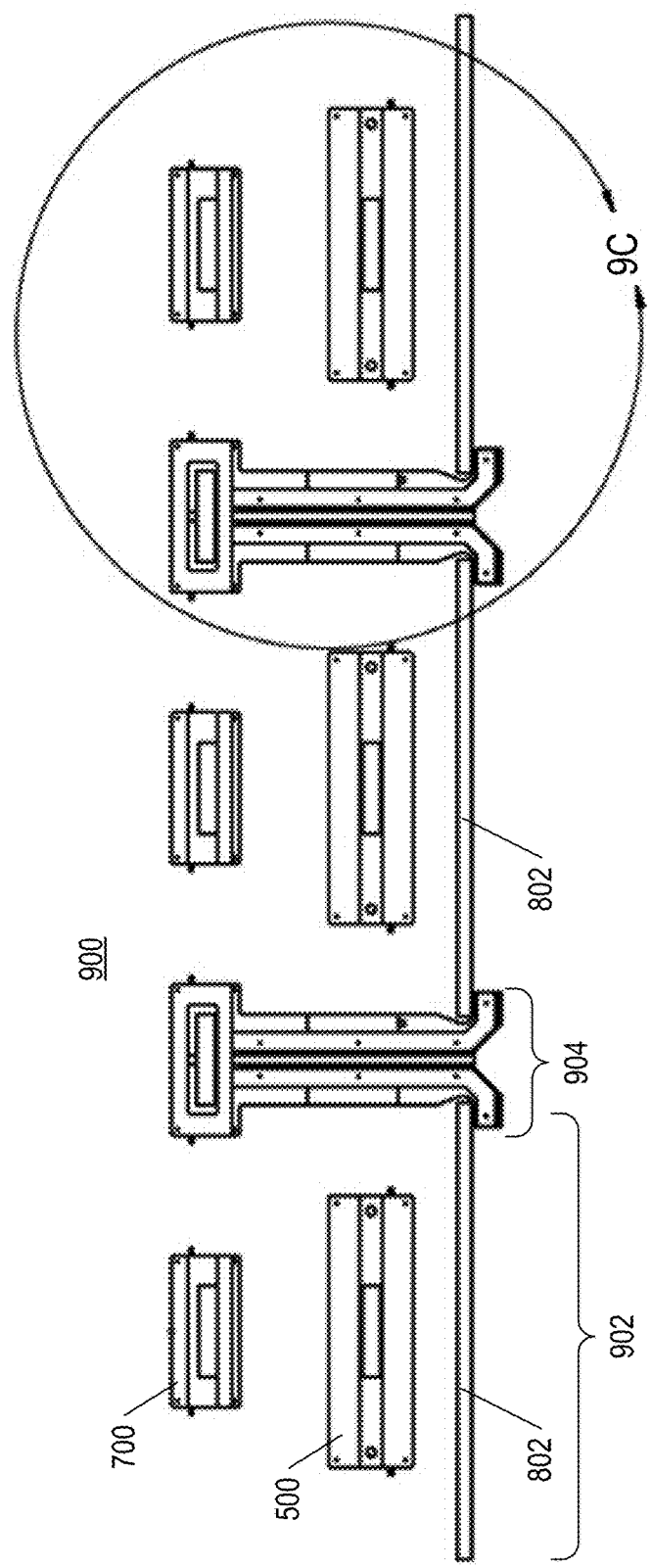
FIG. 9A shows an exemplary schematic of the underside of a multi-region flexible photovoltaic module having midlap structures, in accordance with aspects of the disclosure.
Figure 9B:
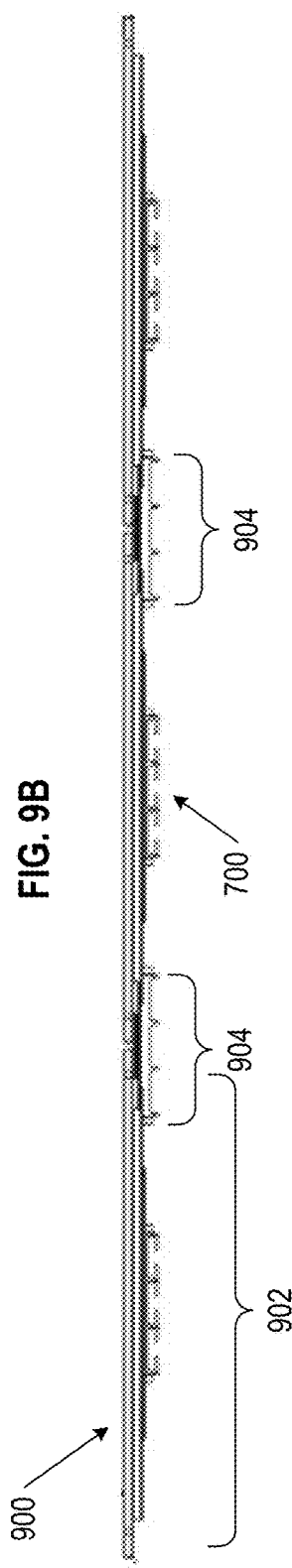
FIG. 9B shows an exemplary schematic rear side view of the multi-region flexible photovoltaic module shown in FIG. 9A, in accordance with aspects of the disclosure.

FIG. 9A shows an exemplary schematic of the underside of multi-region flexible PV module 900 having midlap structures 904 between PV regions 902. FIG. 9B shows an exemplary schematic rear side view of multi-region flexible PV module 900 shown in FIG. 9A. PV module 900 further illustrates offset structures 700, gasket 802, and mounting tracks 500 positioned on the underside of PV module 900 relative to midlap structures 904 (alternatively referred to as "mid-region structures"). Midlap structures 904 are supporting structures for PV modules 900, balancing the dual needs of flexibility and rigidity for PV modules 900. During installation or removal of PV modules 900 from a solar array, midlap structures 904 allow for a controlled degree of bending between PV regions 902, such that the PV module can be easily (and without forced or abrupt motions) fit into the desired location. In such aspects, midlap structures 904 can be understood as located at flexible joint regions. When installed as part of a solar array, midlap structures 904 support PV module 900 at these flexible joint region and can help PV modules 900 withstand both standard installation stresses (e.g., installers walking on top of the modules, physical impacts during transport) and long-term strains (e.g., wind, precipitation, etc.).

In various aspects, midlap structures 904 can be formed of metals, alloys, plastics, other suitable polymer materials, or combinations thereof. Midlap structures 904 can be formed by molding processes, casting processes, 3D printing processes, die cutting, or the like.

Figure 9C:
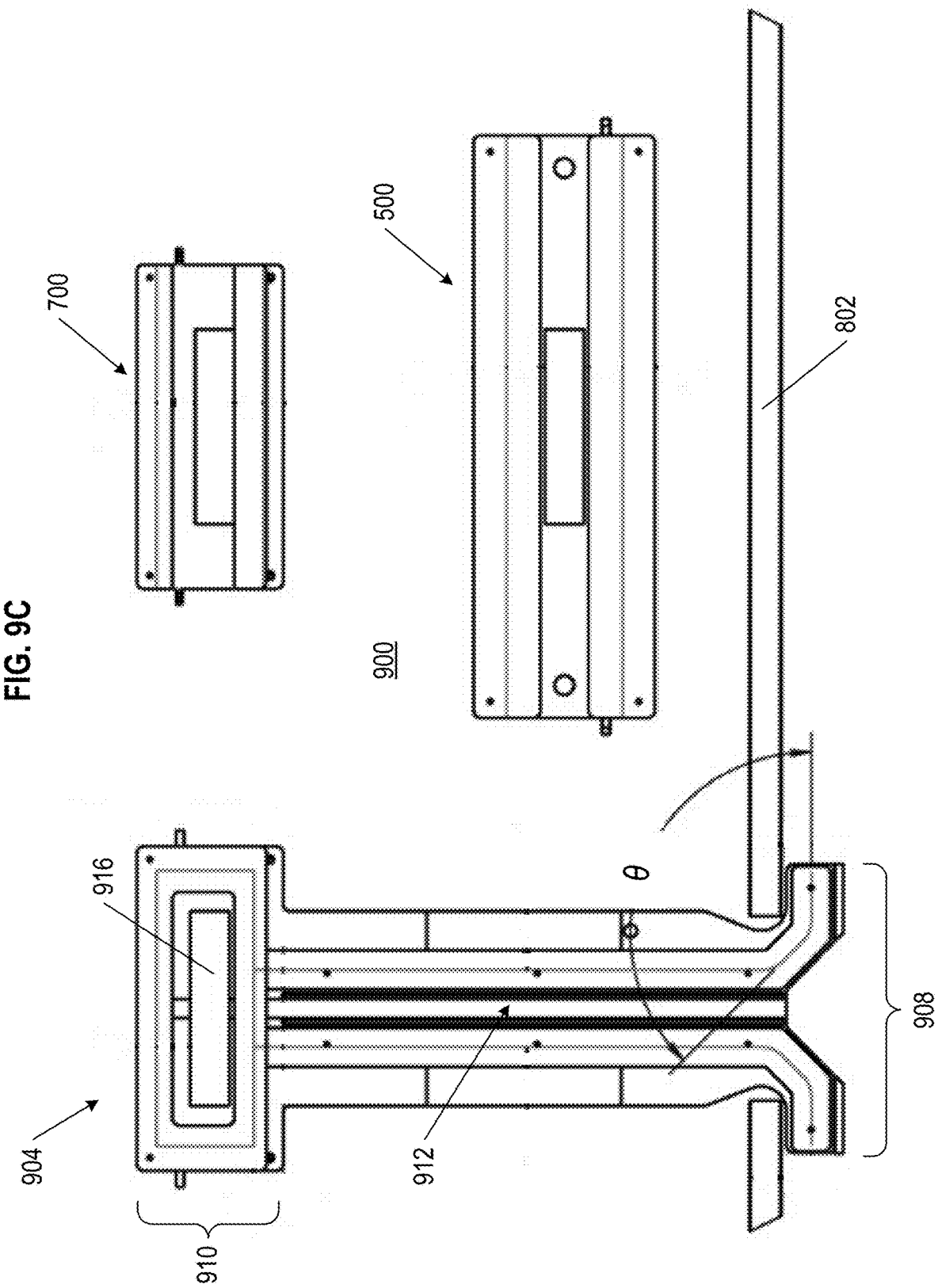
FIG. 9C shows a detail section of the exemplary schematic of the multi-region flexible photovoltaic module shown in FIG. 9A, in accordance with aspects of the disclosure.

FIG. 9C shows detail section of multi-region flexible PV module 900 as shown in FIG. 9A. Midlap structure 904 as shown can have branched head 908, where the sides of branched head 908 can be fit adjacent to gaskets 802, forming a watertight seal for PV module 900. In some aspects, branched head 908 can have a "T-head" with a the branches directly extending at about 90° from the longitudinal axis of midlap structure 904, forming a flat single edge spanning the width of branched head 908. In other aspects, as shown in FIG. 9C, branched head 908 can have a "Y-head" where branches symmetrically extend at an angle θ from the longitudinal axis of midlap structure 904 before ultimately projecting laterally at about 90° from the longitudinal axis of midlap structure 904. In such aspects, the angle θ can be about 135°, or within the range of from 95° to 175°. In other aspects, branched head 908 can have a "K-head" shape, or other shapes as appropriate to both support adjacent PV regions 902 and to form a seal with gaskets 802 proximate to midlap structure 904.

Midlap structure 904 also includes tail region 910, which can overlap with offset structure 700 when attached to the underside of PV module 900. Along the longitudinal axis of midlap structure 904 is wedge groove 912, which provides for a partial gap in midlap structure 904 such that midlap structure 904 is able to compress or bend at an acute angle. Wedge groove 912 is cut into the centerline material of midlap structure 904, where the amount of space provided by wedge groove 912 controls the degree of flexibility two (underside) PV regions 902 of PV module 900 can bend towards each other. Tail region 910 can include stiffening element 916 which spans a part of the width of midlap structure 904 and is located above the pivot point of wedge groove 912, controlling the degree to which midlap structure 904 can flex or bow at acute or obtuse angles from the general horizontal plane defined by the body of midlap structure 904. Stiffening element 916 can act as a limiter, where the legs of midlap structure on either side of wedge groove 912 are restrained to a degree from moving toward each other. In some aspects, the body of midlap structure 904 itself, including laminate that forms midlap structure 904. Side or wing sections on the body of midlap structure 904 can be textured or otherwise offset and used to grip or flex the midlap structure 904.

FIG. 9D is a schematic illustration of midlap structure 904 and reversible configurations of midlap structure 904. In particular, viewed along the cross-sectional line 901, the schematic views 901a, 901b, and 901c show how midlap structure 904 accommodates both flexibility and rigidity needs. As noted above, midlap structure 904 is constructed to have a wedge groove 912, legs 914 on either side of wedge groove, and stiffening element 916. Midlap structure can also include restraint strap 918, which can be a molded linkage connecting the two legs 914. In view 901a, the default, unbent configuration of midlap structure 904 is generally flat; in other words, the top surface of midlap structure 904 is at an 180° angle. Wedge groove 912 is a gap along the longitudinal axis of midlap structure 904. Restraint strap 918 is attached to opposing legs 914 of midlap structure 904 and is slack. Contiguous PV regions 902 of PV module 900 (as in FIG. 9B) connected to midlap structure 904 are also generally flat (forming a 180° horizontal plane) relative to each other. In view 901*b*, the sides of wedge groove 912 are pressed against each other, closing the gap formed by wedge groove 912. Restraint strap 918 remains slack. Contiguous PV regions 902 of PV module 900 connected to midlap structure 904 bend downward from being 180° flat, forming an acute angle on the underside of PV module 900. In other words, wedge groove 912 provides space for the PV module 900 to bend inward, but that distance is limited, being stopped when the two opposing side walls of wedge groove 912 (in other words, legs 914) abut against each other. In some aspects, stiffening element 916 can prevent legs 914 from contacting each other, limiting the degree to which PV module 900 can bend inward. In view 901*c*, the sides of wedge groove 912 are extended further away from each other, but restraint strap 918 is taut. Contiguous PV regions 902 of PV module 900 connected to midlap structure 904 bow upward from being 180° flat, forming an obtuse angle on the underside of PV module 900. In other words, wedge groove 912 allows for PV module 900 to extend or flex outward, but that distance is limited, because the opposing sides of midlap structure 904 being held from further extension by the length of restraint strap 918.

In such embodiments of multi-region PV modules considered herein, the flexible structures or joints between PV regions must have sufficient resilience and operational lifespan to withstand expected strain, fatigue, and stress of the PV modules. In particular, multi-region PV modules are expected to endure physical stressors with the flexible joints providing for slack and relief of load or tension resulting from physical stressors. Such physical stressors can include, but are not limited to bending: during transport, from being walked on during installation, wind shear and lift as part of an installed solar array, weight of other physically connected solar array components, thermal expansion and contraction, and combinations thereof. The ability of the flexible joints to alter and then restore shape can be considered a cyclical motion, where the flexible joint has a defined strain-life (alternatively referred to as fatigue or stress-limit).

In several aspects, midlap structures 902 are constructed to have an operational lifetime with resilience to the repeated, cyclical physical strains of bending. In some aspects, midlap structures 902 as disclosed herein maintain their structural integrity for at least 30,000 cycles of 5° bends. In other aspects, midlap structures 902 as disclosed herein maintain their structural integrity for at least 1,000 cycles of 15° bends.

In further alternative embodiments, PV modules as discussed herein may be inductively coupled with an underlying power mat(s) or lattice. Such an induction-based system would eliminate the need for most wiring and physical connectors. The underlying power mat(s) or lattice would be disposed on a roof deck or battens of a roof structure, and electrically coupled with minor electrical boxes or optimizers that further connect with an electrical main box. PV tiles would be arranged and secured over corresponding sections of the power mat(s) or lattice, such that the underlying power mat(s) or lattice would receive electricity collected by solar cells through induction, and subsequently convey that electricity to the minor electrical boxes and/or electrical main box.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Details of the system may vary considerably in its specific implementation, while still being encompassed by the present disclosure. Accordingly, the invention is not limited, except as by the appended claims.

While the above description describes various embodiments of the invention and the best mode contemplated, regardless how detailed the above text, the invention can be practiced in many ways. In general, the terms used in the following claims should not be construed to limit the invention to the specific examples disclosed in the specification, unless the above Detailed Description section explicitly defines such terms. As noted above, particular terminology used when describing certain features or aspects of the invention should not be taken to imply that the terminology is being redefined herein to be restricted to any specific characteristics, features, or aspects of the invention with which that terminology is associated. Further, any specific numbers noted herein are only examples; alternative implementations may employ differing values or ranges, and can accommodate various increments and gradients of values within and at the boundaries of such ranges. Accordingly, the actual scope of the invention encompasses not only the disclosed examples, but also all equivalent ways of practicing or implementing the invention under the claims.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in textual context of this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A multi-region photovoltaic (PV) module comprising:
a first PV region;
a second PV region;
a third PV region, the first PV region, second PV region, and third PV region being arranged linearly within the module, with a spacing zone between each of the PV regions;
a module frame comprising first, second and third frame portions for supporting the first, second and third PV regions, respectively, each module frame portion having lateral sides and longitudinal sides,
wherein the module frame further comprises bendable discrete midlap structures disposed on an underside of the PV module between (i) the first PV region and the second PV region and (ii) the second PV region and the third PV region that couple the respective frame portions, wherein each midlap structure comprises a wedge groove running along a longitudinal axis of the midlap structure that allows for the midlap structure to bend inward until opposing walls of the wedge groove abut each other; and
electrical power connections adapted to electrically connect the PV module with a circuit.

2. The multi-region PV module of claim 1, wherein each midlap structure further comprises:
a branched head; and
a restraint strap; configured to allow for the midlap structure to bend outward until the restraint strap is taut.

3. The multi-region PV module of claim 2, wherein the branched head comprises a plurality of branches extending outwardly at an angle from the midlap structure.

4. The multi-region PV module of claim 1, wherein each PV region further comprises two solar cells, and wherein the solar cells of each PV region are electrically connected to each other.

5. The multi-region PV module of claim 1 further comprising:
track mounting structures coupled to the underside of each PV region of the PV module, the track mounting structures being in alignment along a single axis batten hooks configured to slidably latch within the track mounting structures and, mounted within the track mounting structures, arranged to mechanically secure the module to battens of an underlying roof structure; and
offset structures secured to the underside of the PV module, adapted to mechanically couple the module to portions of the underlying roof structure.

6. The multi-region PV module of claim 5, wherein each of the batten hooks are formed to have:
a hook body;
an upper-fore ledge and an upper-aft ledge positioned opposite of each other at the top of the hook body and forming a rail gap therebetween; and
a lower ledge positioned at the bottom of the hook body, extending laterally from the hook body.

7. The multi-region PV module of claim 5, further comprising a plurality of gaskets coupled to the underside of the PV region of the PV module, arranged to form a watertight seal between the module and the underlying roof structure.

8. The multi-region PV module of claim 1, wherein the first frame portion is separated from the second frame portion by one of the spacing zones.

9. The multi-region PV module of claim 1, further comprising:
a fourth PV region, arranged linearly with and adjacent to the third PV region; and
a midlap structure on the underside of the PV module at a location corresponding to the spacing zone between (iii) the third PV region and the fourth PV region.

10. The multi-region PV module of claim 1, wherein the midlap structure further comprises a stiffening element which spans a part of the width of the midlap structure, wherein the stiffening element is configured to further control the degree the midlap structure bends.

11. A multi-region photovoltaic (PV) module comprising:
a first PV region;
a second PV region;
a third PV region, the first PV region, second PV region, and third PV region being arranged linearly within the module, with a spacing zone between each of the PV regions;
a module frame comprising bendable discrete midlap structures disposed on an underside of the PV module between (i) the first PV region and the second PV region and (ii) the second PV region and the third PV region that couple the respective PV regions together, wherein each midlap structure comprises a wedge groove running along a longitudinal axis of the midlap structure that allows for the midlap structure to bend inward until opposing walls of the wedge groove abut each other; and
electrical power connections adapted to electrically connect the PV module with a circuit.

* * * * *